United States Patent
Somervell et al.

(10) Patent No.: US 8,980,538 B2
(45) Date of Patent: Mar. 17, 2015

(54) CHEMI-EPITAXY IN DIRECTED SELF-ASSEMBLY APPLICATIONS USING PHOTO-DECOMPOSABLE AGENTS

(71) Applicant: Tokyo Electron Limited, Tokyo (JP)

(72) Inventors: Mark H. Somervell, Austin, TX (US); Michael A. Carcasi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 43 days.

(21) Appl. No.: 13/830,859

(22) Filed: Mar. 14, 2013

(65) Prior Publication Data

US 2014/0272723 A1    Sep. 18, 2014

(51) Int. Cl.
*G03F 7/26* (2006.01)
*G03F 7/11* (2006.01)
(Continued)

(52) U.S. Cl.
CPC ............. *G03F 7/11* (2013.01); *G03F 7/0045* (2013.01); *G03F 7/0002* (2013.01);
(Continued)

(58) Field of Classification Search
CPC ..... G03F 7/038; G03F 7/0392; G03F 7/0382; G03F 7/38; G03F 7/40; G03F 7/004; G03F 7/028; G03F 7/039; G03F 7/2024; G03F 7/26; G03F 7/32; G03F 7/033; G03F 7/0388; G03F 7/405; C08F 2/46; C08F 2/50; C08F 220/18; C08F 24/00; C08F 2/38; C08F 2810/20; C08L 2666/02; C08L 2666/24; C08L 53/00; C08L 2312/00; C08L 33/00; C08L 53/005; C08K 5/17; C08K 13/02; B01J 20/267
USPC .......................... 430/325, 315, 324, 330, 313
See application file for complete search history.

(56) References Cited

U.S. PATENT DOCUMENTS

| 5,344,742 A | 9/1994 | Sinta et al. |
| 5,650,261 A | 7/1997 | Winkle |

(Continued)

FOREIGN PATENT DOCUMENTS

| DE | 102012105384 A1 | 9/2012 |
| KR | 20120133272 A | 12/2012 |

(Continued)

OTHER PUBLICATIONS

Bielawski et al., "Regiospecific One-Pot Synthesis of Diaryliodonium Tetrafluoroborates from Arylboronic Acids and Aryl Iodides," J. Org. Chem. 73:4602-4607, 2008.

(Continued)

Primary Examiner — Caleen Sullivan
(74) Attorney, Agent, or Firm — Wood, Herron & Evans, LLP

(57) ABSTRACT

A method of forming a layered substrate comprising a self-assembled material is provided. The method includes forming a first layer of material on a substrate, forming a layer of a radiation sensitive material on the first layer of material, imaging the layer of the radiation sensitive material with patterned light, heating the layer of the radiation sensitive material to a temperature at or above the cross-linking reaction temperature, developing the imaged layer, and forming the block copolymer pattern. The radiation sensitive material comprises at least one photo-sensitive component selected from (a) a photo-decomposable cross-linking agent, (b) a photo-base generator, or (c) a photo-decomposable base; and a cross-linkable polymer, wherein imaging by the patterned light provides a pattern defined by a first region having substantial portions of a decomposed photo-sensitive component surrounded by regions having substantial portions of intact photo-sensitive component.

21 Claims, 7 Drawing Sheets

(51) Int. Cl.

| | | |
|---|---|---|
| *G03F 7/004* | (2006.01) | |
| *G03F 7/00* | (2006.01) | |
| *G03F 7/039* | (2006.01) | |
| *G03F 7/16* | (2006.01) | |
| *G03F 7/32* | (2006.01) | |
| *G03F 7/40* | (2006.01) | |
| *B82Y 10/00* | (2011.01) | |
| *B82Y 40/00* | (2011.01) | |

(52) U.S. Cl.
CPC ............ *G03F 7/0035* (2013.01); *G03F 7/039* (2013.01); *G03F 7/168* (2013.01); *G03F 7/322* (2013.01); *G03F 7/325* (2013.01); *G03F 7/40* (2013.01); *B82Y 10/00* (2013.01); *B82Y 40/00* (2013.01)
USPC ........... 430/325; 430/330; 430/315; 430/324; 430/313

(56) References Cited

U.S. PATENT DOCUMENTS

| | | |
|---|---|---|
| 6,303,477 B1 | 10/2001 | Ianovitch |
| 6,855,476 B2 | 2/2005 | Ferreira et al. |
| 7,521,094 B1 | 4/2009 | Cheng et al. |
| 7,579,278 B2 | 8/2009 | Sandhu |
| 7,687,220 B2 | 3/2010 | Yamato et al. |
| 7,723,009 B2 | 5/2010 | Sandhu et al. |
| 7,754,518 B2 | 7/2010 | Koelmel et al. |
| 7,923,373 B2 | 4/2011 | Sandhu |
| 8,039,196 B2 | 10/2011 | Kim et al. |
| 8,083,953 B2 | 12/2011 | Millward et al. |
| 8,241,822 B2 | 8/2012 | Yamato et al. |
| 8,420,304 B2 | 4/2013 | Inatomi |
| 8,603,867 B2 | 12/2013 | Kim et al. |
| 2002/0192619 A1 | 12/2002 | Besek |
| 2002/0193619 A1 | 12/2002 | Crivello et al. |
| 2003/0084925 A1 | 5/2003 | Nakajima et al. |
| 2005/0056219 A1 | 3/2005 | Dip et al. |
| 2005/0215713 A1 | 9/2005 | Hessell et al. |
| 2006/0123658 A1 | 6/2006 | Izumi |
| 2006/0251989 A1 | 11/2006 | Breyta et al. |
| 2007/0037412 A1 | 2/2007 | Dip et al. |
| 2007/0237697 A1 | 10/2007 | Clark |
| 2007/0238028 A1 | 10/2007 | Inatomi |
| 2008/0193658 A1* | 8/2008 | Millward ................ 427/401 |
| 2008/0318005 A1 | 12/2008 | Millward |
| 2009/0081827 A1 | 3/2009 | Yang et al. |
| 2009/0087664 A1 | 4/2009 | Nealey et al. |
| 2009/0181171 A1 | 7/2009 | Cheng et al. |
| 2009/0200646 A1 | 8/2009 | Millward et al. |
| 2009/0236309 A1 | 9/2009 | Millward et al. |
| 2010/0055621 A1 | 3/2010 | Hatakeyama et al. |
| 2010/0227276 A1 | 9/2010 | Mizuno |
| 2011/0033786 A1 | 2/2011 | Sandhu |
| 2011/0059299 A1 | 3/2011 | Kim et al. |
| 2011/0147984 A1 | 6/2011 | Cheng et al. |
| 2011/0147985 A1 | 6/2011 | Cheng et al. |
| 2011/0229120 A1 | 9/2011 | Takaki et al. |
| 2011/0272381 A1 | 11/2011 | Millward et al. |
| 2012/0046415 A1 | 2/2012 | Millward et al. |
| 2012/0046421 A1 | 2/2012 | Darling et al. |
| 2012/0077127 A1 | 3/2012 | Sills et al. |
| 2012/0088192 A1 | 4/2012 | Trefonas et al. |
| 2012/0141939 A1* | 6/2012 | Thackeray et al. ........ 430/285.1 |
| 2013/0189504 A1 | 7/2013 | Nealey et al. |
| 2014/0061154 A1 | 3/2014 | Kim et al. |
| 2014/0099583 A1 | 4/2014 | Holmes et al. |
| 2014/0154630 A1 | 6/2014 | Schmid et al. |

FOREIGN PATENT DOCUMENTS

| | | |
|---|---|---|
| WO | 03016209 A1 | 2/2003 |
| WO | 2012071330 A1 | 5/2012 |
| WO | 2012084558 A1 | 6/2012 |
| WO | 2012175343 A1 | 12/2012 |
| WO | 20120175342 A2 | 12/2012 |
| WO | 2013010730 A1 | 1/2013 |

OTHER PUBLICATIONS

Cheng et al., "Developing Directly Photodefinable Substrate Guiding Layers for Block Copolymer Directed Self-Assembly (DSA) Patterning," Proc. of SPIE. 7972:79722l(1)-79722l(13), 2011.

Cho et al., "Polymer Bound Photobase Generators and Photoacid Generators for Pitch Division Lithography," Proc. of SPIE. 7972:797221(1)-797221(8), 2011.

Cupta, "Photoacid Generators for Catalytic Decomposition of Polycarbonate," Thesis for Master of Science, Georgia Institute of Technology, 2006, 137 pp.

Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).

Liu et al., "Integration of block copolymer directed assembly with 193 immersion lithography," J. Vac. Sci. Technol. B. 28(6):C6B30-C6B34, 2010.

Maki et al., "Photocleavable Molecule for Laser Desorption Ionization Mass Spectrometry," J. Org. Chem. 72:6427-6433, 2007.

Padmanaban et al., "Application of Photodecomposable Base Concept to 193 nm Resists," Proc. of SPIE. 3999:1136-1146, 2000.

Ross et al., "Si-containing block copolymers for self-assembled nanolithography," J. Vac. Sci. Technol. B. 26 (6):2489-2494, 2008.

Ruebner et al., "A cyclodextrin dimer with a photocleavable linker as a possible carrier for the photosensitizer in photodynamic tumor therapy," PNAS. 96(26):14692-14693, 1999.

Skulski, "Organic Iodine(I, III, and V) Chemistry: 10 Years of Development at the Medical University of Warsaw, Poland," Molecules. 5:1331-1371, 2000.

Weissman et al., "Recent advances in ether dealkylation," Tetrahedron. 61:7833-7863, 2005.

Cheng et al., "Simple and Versatile Methods to Integrate Directed Self-Assembly with Optical Lithography Using a Polarity-Switched Photoresist," ACS Nano, 4(8):4815-4823, 2010.

Cheng, et al, "EUVL Compatible, LER Solutions using Functional Block Copolymers," Alternative Lithographic Technologies IV, Proc. of SPIE, vol. 8323, 2012, 11 pp.

Ross et al., "Templated Self-Assembly of Block Copolymer Films," 2012 Materials Research Society (MRS) Fall Meeting & Exhibit, Symposium S: Directed Self-Assembly for Nanopatterning, Nov. 25-30, 2012, Boston, Massachussetts, 64 pp.

Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.

Gotrik et al., "Morphology Control in Block Copolymer Films Using Mixed Solvent Vapors," ACS Nano, 6 (9):8052-8059, 2012.

Hamersky et al., "Self-Diffusion of a Polystyrene-Polyisoprene Block Copolymer," Journal of Polymer Science: Part B: Polymer Physics. 34:2899-2909, 1996.

Jung et al., "Orientation-Controlled Self-Assembled Nanolithography Using a Polystyrene-Polydimethylsiloxane Block Copolymer," Nano Lett. 7(7):2046-2050, 2007.

Jung et al., "A Path to Ultranarrow Patterns Using Self-Assembled Lithography," Nano Lett. 10:1000-1005, 2010.

Postnikov et al., "Study of resolution limits due to intrinsic bias in chemically amplified photoresists," J. Vac. Sci. Technol. B. 17(6):3335-3338, 1999.

Rathsack et al., "Pattern Scaling with Directed Self Assembly Through Lithography and Etch Process Integrations," Proc. of SPIE 8323, Alternative Lithographic Technologies IV, 83230B (Mar. 1, 2012); doi:10.1117/12.916311, 14 pp.

International Searching Authority, International Search Report and Written Opinion issued in corresponding International Application No. PCT/US13/40815, mailed Oct. 21, 2013, 15 pp.

Choi et al., "Square Arrays of Holes and Dots Patterned from a Linear ABC Triblock Terpolymer," ACS Nano, 6 (9):8342-8348, 2012.

(56) References Cited

OTHER PUBLICATIONS

Foubert et al., "Impact of post-litho LWR smoothing processes on the post-etch patterning result," Proc. of SPIE, 7972:797213(1)-797213(10), 2011.

Tavakkoli K.G. et al., "Templating Three-Dimensional Self-Assembled Structures in Bilayer Block Copolymer Films," Science, 336:1294-1298, 2012.

Cushen et al., "Oligosaccharide/Silicon-Containing Block Copolymers with 5 nm Features for Lithographic Applications" ACS Nano, vol. 6, No. 4, 2012, pp. 3424-3433.

Dean, et al., "Orientation Control of Silicon-containing Block Copolymer Films," Dept. of Chemical Engineering, The University of Texas at Austin, 1 p.

Jarnagin, et al., "Investigation of High c Block Copolymers for Directed Self-Assembly: Synthesis and Characterization of PS-b-PHOST," Alternative Lithographic Technologies IV, Proc. of SPIE, vol. 8323, 2012, 9 pp.

Lickteig et al., "Optimization of an Integrated and Automated Macro Inspection System for the Utilization of Wafer Color Variation Detection in a Photolithography Cluster", Metrology, Inspection, and Process Control for Microlithography, Proc. of SPIE vol. 6152, 9 pp.

Zhao et al., "Self-reorganization of mixed poly(methyl methacrylate)/polystyrene brushes on planar silica substrates in reponse to combined selective solvent treatments and thermal annealing", Polymer 45 (2004) 7979-7988.

International Searching Authority, Search Report and Written Opinion issued in corresponding International Application No. PCT/US2014/016766 dated May 26, 2014, 11 pages.

International Searching Authority, Search Report and Written Opinion issued in corresponding International Application No. PCT/US2014/016776 dated May 30, 2014, 12 pages.

Vayer et al., "Perpendicular orientation of cylindrical domains upon solvent annealing thin films of polystyrene-b-polylactide", Thin Solid Films 518 (2010) 3710-3715.

Peng et al., "Development of Nanodomain and Fractal Morphologies in Solvent Annealed Block Copolymer Thin Films", Macromolecular Rapid Communications 2007, 28, 1422-1428.

Yu et al., "Self-assembly of polystyrene-poly(4-vinylpyridine) in deoxycholic acid melt", Polymer, Elsevier Science Publishers B.V, GB, vol. 52, No. 18, Jul. 13, 2011, pp. 3994-4000.

International Searching Authority, Search Report and Written Opinion issued in corresponding International Application No. PCT/US2014/026969 dated Jul. 16, 2014, 15 pages.

International Searching Authority, Search Report and Written Opinion issued in corresponding International Application No. PCT/US2014/027016 dated Jul. 23, 2014, 11 pages.

International Searching Authority, Search Report and Written Opinion issued in corresponding International Application No. PCT/US2014/023926 dated Jul. 25, 2014, 10 pages.

International Searching Authority, Search Report and Written Opinion issued in corresponding International Application No. PCT/US2014/016760 mailed Nov. 6, 2014, 11 pages.

\* cited by examiner

US 8,980,538 B2

CHEMI-EPITAXY IN DIRECTED SELF-ASSEMBLY APPLICATIONS USING PHOTO-DECOMPOSABLE AGENTS

FIELD OF THE INVENTION

This disclosure is related to methods for forming patterns in layered articles, and the layered articles formed therefrom; and more specifically, to utilizing chemi-epitaxy and photo-decomposable agents in directed self-assembly applications.

BACKGROUND OF THE INVENTION

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Photolithography is a standard technique used to manufacture semiconductor integrated circuitry by transferring geometric shapes and patterns on a mask to the surface of a semiconductor wafer. Generally, a thin coating of a film of a radiation sensitive composition, such as a photoresist, is first applied to a substrate material, such as silicon wafers used for making integrated circuits. The coated substrate is then baked to evaporate any solvent in the photoresist composition and to fix the coating onto the substrate. The baked and coated surface of the substrate is next subjected to an image-wise exposure to radiation. The radiation exposure causes a chemical transformation in the exposed areas of the coated surface. Visible light, deep ultraviolet (DUV) light, extreme ultraviolet (EUV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist, thereby leaving features that can be further utilized to create the integrated circuits. However, current state-of-the-art photolithography tools allow minimum feature sizes down to about 25 nm. Accordingly, new methods are needed to provide smaller features.

Self-assembly of block copolymers (BCPs) has been considered a potential tool for improving the resolution to better values than those obtainable by prior art lithography methods alone. Block copolymers are compounds useful in nanofabrication because they may undergo an order-disorder transition on cooling below a certain temperature (order-disorder transition temperature ODT) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1 nm to 5 nm and may be manipulated by modification of the chemical compositions of the blocks of the copolymer.

A block copolymer may form many different phases upon self-assembly, dependent upon the volume fractions of the blocks, degree of polymerization within each block type (i.e., number of monomers of each respective type within each respective block), the optional use of a solvent and surface interactions. When applied in a thin film, the geometric confinement may pose additional boundary conditions that may limit the numbers of phases. In general, spherical (e.g., cubic), cylindrical (e.g., tetragonal or hexagonal) and lamellar phases (i.e., self-assembled phases with cubic, hexagonal or lamellar space-filling symmetry) are practically observed in thin films of self-assembled block copolymers, and the phase type observed may depend upon the relative volume fractions of the different polymer blocks. The self-assembled polymer phases may orient with symmetry axes parallel or perpendicular to the substrate and lamellar and cylindrical phases are interesting for lithography applications, as they may form line and spacer patterns and hole arrays, respectively, and may provide good contrast when one of the domain types is subsequently etched.

Two methods used to guide or direct self-assembly of a block copolymer onto a surface are graphoepitaxy and chemical pre-patterning, also called chemi-epitaxy. In the graphoepitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance, if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

In chemi-epitaxy, the self-assembly of block copolymer domains is guided by a chemical pattern (i.e., a chemical template) on the substrate. Chemical affinity between the chemical pattern and at least one of the types of copolymer blocks within the block copolymer chain may result in the precise placement (also referred to herein as "pinning") of one of the domain types onto a corresponding region of the chemical pattern on the substrate. For instance, if the block copolymer is a di-block copolymer with A and B blocks, where A is hydrophilic and B is hydrophobic in nature, and the chemical pattern comprises of a surface having hydrophobic regions adjacent to regions that are neutral to both A and B, the B domain may preferentially assemble onto the hydrophobic region and consequently force subsequent alignment of both A and B blocks on the neutral areas. As with the graphoepitaxy method of alignment, the resolution may be improved over the resolution of the patterned substrate by the block copolymer pattern subdividing the spacing of pre-patterned features on the substrate (so-called density or frequency multiplication). However, chemi-epitaxy is not limited to a linear pre-pattern; for instance, the pre-pattern may be in the form of a 2-D array of dots suitable as a pattern for use with a cylindrical phase-forming block copolymer. Graphoepitaxy and chemi-epitaxy may be used, for instance, to guide the self-organization of lamellar or cylindrical phases, where the different domain types are arranged side-by-side on a surface of a substrate.

Accordingly, to utilize the advantages provided by graphoepitaxy and chemi-epitaxy of block copolymers, new lithographic patterning and directed self-assembly techniques are needed.

SUMMARY OF THE INVENTION

Embodiments of the invention provide a method for forming a layered substrate comprising a self-assembled material. The method includes performing a photolithographic patterning utilizing a radiation sensitive material comprising at least one photo-sensitive component selected from (a) a photodecomposable cross-linking agent, (b) a photo-base generator, or (c) a photo-decomposable base, which is followed by forming a block copolymer pattern comprising the self assembled material derived from a block copolymer.

According to an embodiment, a method of forming a layered substrate is provided, comprising forming a first layer of material on a substrate; and forming a layer of a radiation sensitive material on the first layer of material. The radiation sensitive material comprises at least one photo-sensitive component selected from (a) a photo-decomposable cross-linking agent, (b) a photo-base generator, or (c) a photo-decomposable base; and a cross-linkable polymer; or a combination thereof. The method further comprises imaging the layer of the radiation sensitive material with patterned light to form a pattern in the layer of the radiation sensitive material, wherein the pattern is defined by a first region having substantial portions of the photo-sensitive component decomposed, and a second region having substantial portions of the photo-sensitive component intact; heating the layer of the radiation sensitive material to a temperature at or above the cross-linking reaction temperature to cross-link the cross-linkable polymer in one of the first or second regions to form a cross-linked region, while the other one of the first or second regions remains as a non-crosslinked region; developing the imaged layer to remove the non-crosslinked region; and forming a block copolymer pattern comprising the self-assembled material derived from a block copolymer.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
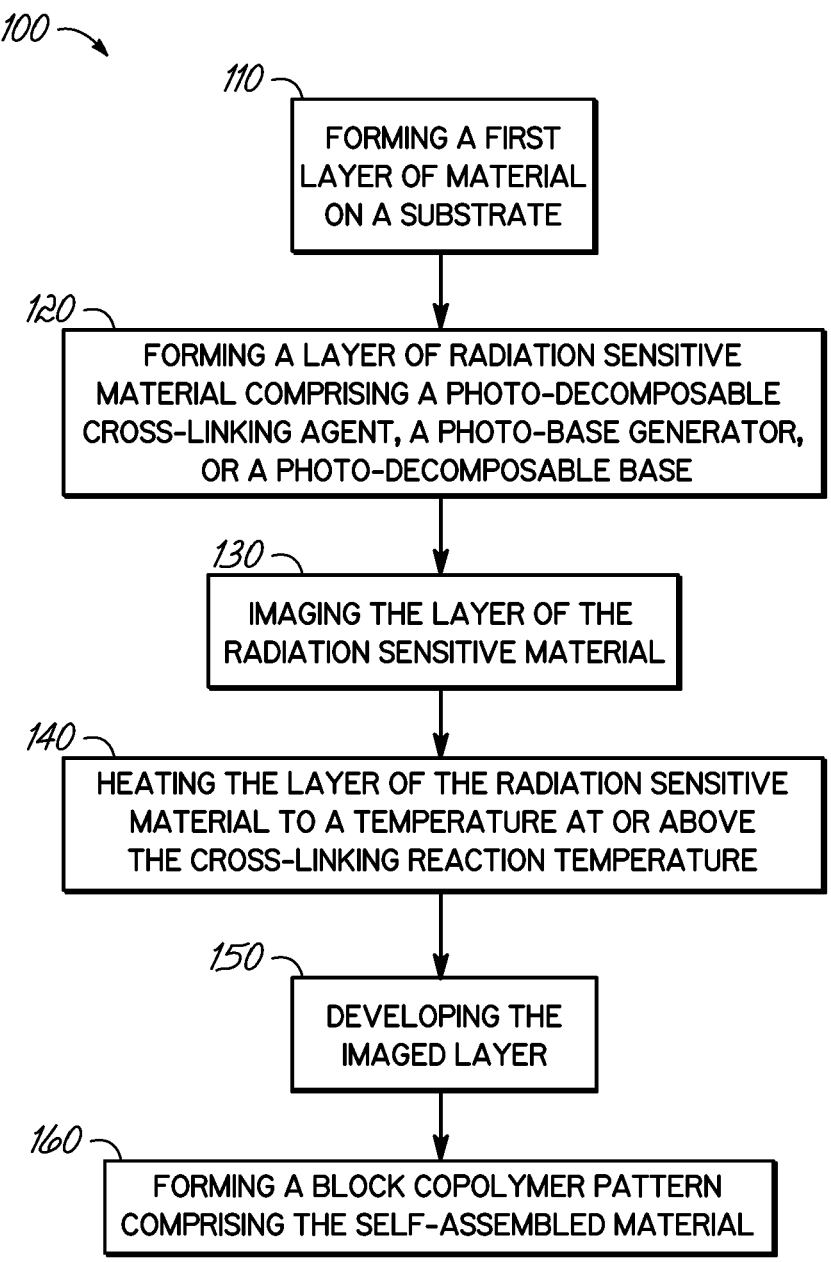
FIG. 1 is a flow chart illustrating a method for forming a layered substrate comprising a self-assembled material utilizing a photo-sensitive component, in accordance with embodiments of the invention.

Materials and methods for forming a layered substrate comprising a self-assembled material are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi N$ value, with other polymer blocks of unlike monomer types, that is sufficient for phase separation to occur. $\chi$ is the Flory-Huggins interaction parameter and N is the total degree of polymerization for the block copolymer. According to embodiments of the present invention, the $\chi N$ value of one polymer block with at least one other polymer block in the larger copolymer may be equal to or greater than about 10.5.

As used herein, the term "block copolymer" means and includes a polymer composed of chains where each chain contains two or more polymer blocks as defined above and at least two of the blocks are of sufficient segregation strength (e.g., $\chi N > 10.5$) for those blocks to phase separate. A wide variety of block polymers are contemplated herein including di-block copolymers (i.e., polymers including two polymer blocks (AB)), tri-block copolymers (i.e., polymers including three polymer blocks (ABA or ABC)), multi-block copolymers (i.e., polymers including more than three polymer blocks (ABCD, etc.)), and combinations thereof.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The terms "microphase segregation" and "microphase separation," as used herein mean and include the properties by which homogeneous blocks of a block copolymer aggregate mutually, and heterogeneous blocks separate into distinct domains. In the bulk, block copolymers can self assemble into ordered morphologies, having spherical, cylindrical, lamellar, bicontinuous gyroid, or miktoarm star microdomains, where the molecular weight of the block copolymer dictates the sizes of the microdomains formed.

The domain size or pitch period ($L_0$) of the self-assembled block copolymer morphology may be used as a basis for designing critical dimensions of the patterned structure. Similarly, the structure period ($L_S$), which is the dimension of the feature remaining after selectively etching away one of the polymer blocks of the block copolymer, may be used as a basis for designing critical dimensions of the patterned structure. The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), supercritical fluid-assisted annealing, or absorption-based annealing (e.g., optical baking). As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar (e.g., organometallic-containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

In addition to interactions between the polymer block species, the self-assembly of block copolymers can be influenced by topographical features, such as steps or guides extending perpendicularly from the horizontal surface on which the block copolymers are deposited. For example, a di-block copolymer, a copolymer formed of two different polymer block species, may form alternating domains, or regions, which are each formed of a substantially different polymer block species. When self-assembly of polymer block species occurs in the area between the perpendicular walls of a step or guides, the steps or guides may interact with the polymer blocks such that, e.g., each of the alternating regions formed by the blocks is made to form a regularly spaced apart pattern with features oriented generally parallel to the walls and the horizontal surface.

Such self-assembly can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a block copolymer mask are disclosed in U.S. Pat. No. 7,579,278; and U.S. Pat. No. 7,723,009, the entire disclosure of each of which is incorporated by reference herein.

In accordance with embodiments of the present invention and in reference to FIG. 1, a method 100 for forming a layered substrate comprising a self-assembled material is provided, comprising forming a first layer of material on a substrate in 110; forming a layer of a radiation sensitive material on the first layer of material in 120; imaging the layer of the radiation sensitive material with patterned light to form a pattern in the layer of radiation sensitive material in 130, heating the layer of the radiation sensitive material to a temperature at or above the cross-linking reaction temperature in 140; developing the imaged layer in 150; and forming a block copolymer pattern comprising the self-assembled material in 160. The radiation sensitive material comprises at least one photo-sensitive component selected from (a) a photo-decomposable cross-linking agent, (b) a photo-base generator, or (c) a photo-decomposable base; and a cross-linkable polymer, wherein imaging by the patterned light provides a pattern defined by a first region having substantial portions of a decomposed photo-sensitive component surrounded by regions having substantial portions of intact photo-sensitive component.

(a) Photo-Decomposable Cross-Linking Agent

In accordance with an embodiment, the photo-sensitive component is a photo-decomposable cross-linking agent, which is suitable for use in photolithographic applications.

The photo-decomposable cross-linking agent comprises a plurality of a first functional group (FG') covalently bonded to a photo-decomposable functional group. In accordance with another embodiment, a radiation sensitive material is provided that comprises the photo-decomposable cross-linking agent, and a cross-linkable polymer comprising a plurality of a second functional group (FG"), wherein the second functional group (FG") reacts with the first functional group (FG') upon heating to or above a cross-linking reaction temperature to provide a cross-linked polymer.

Figure 2:
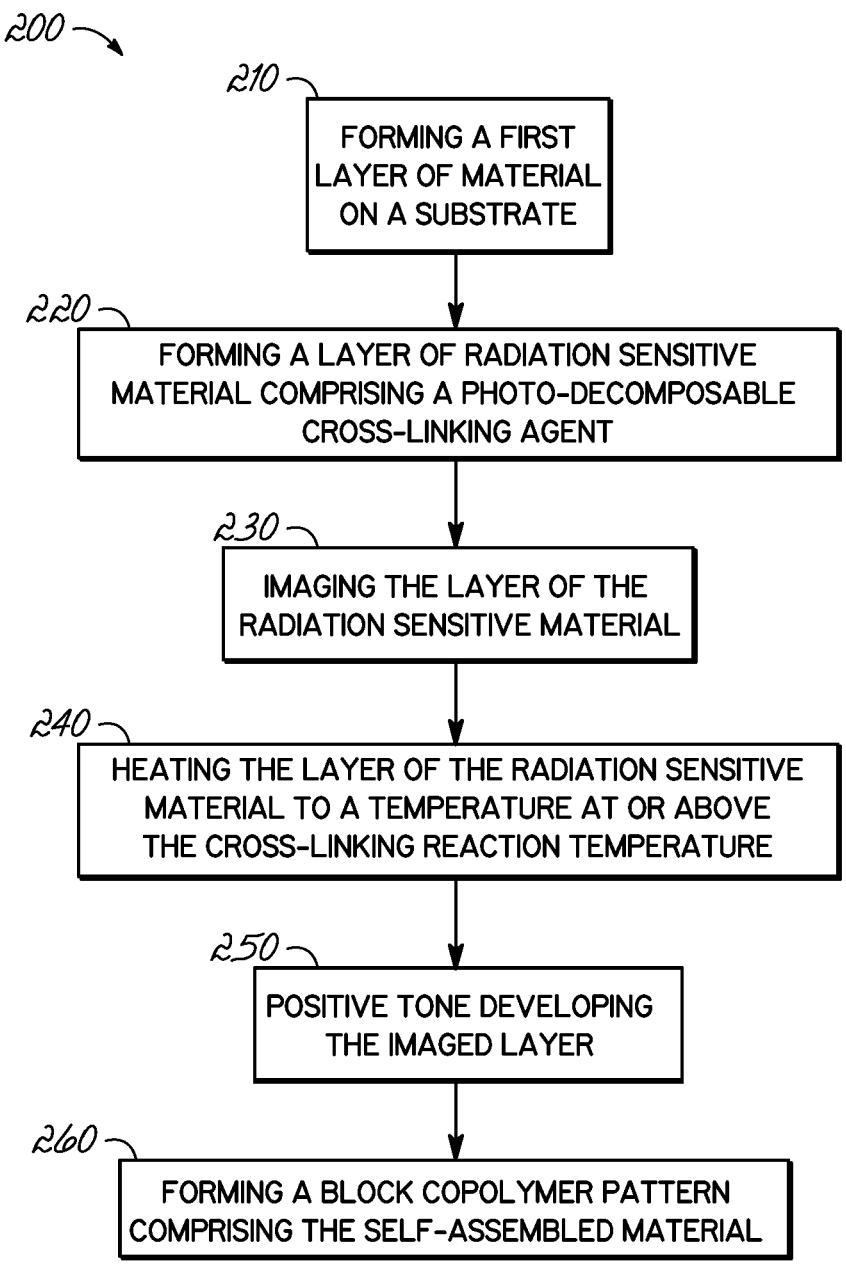
FIG. 2 is a flow chart illustrating a method for forming a layered substrate comprising a self-assembled material utilizing a photodegradable cross-linking agent, in accordance with an embodiment of the invention.

Accordingly, as shown in FIG. 2, a method 200 for forming a layered substrate comprising a self-assembled material is provided, comprising forming a first layer of material on a substrate in 210; forming a layer of a radiation sensitive material comprising a photo-decomposable cross-linking agent in 220; imaging the layer of the radiation sensitive material in 230; heating the layer of the radiation sensitive material to a temperature at or above the cross-linking reaction temperature in 240; positive tone developing the imaged layer in 250; and forming a block copolymer pattern comprising the self-assembled material in 260. In addition to comprising the photo-decomposable cross-linking agent, the radiation sensitive material further comprises the cross-linkable polymer. And in accordance with this embodiment, imaging the radiation sensitive layer by the patterned light provides a pattern defined by a first region having substantial portions of a decomposed photo-decomposable cross-linking agent surrounded by regions having substantial portions of intact photo-decomposable cross-linking agent. The method 200 is schematically exemplified in FIGS. 3A-3F.

Figure 3A:
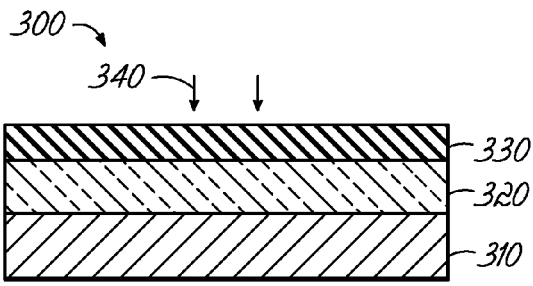
FIGS. 3A to 3F illustrate a positive-tone lithographic patterning and directed self-assembly technique, in accordance with the method illustrated in FIG. 2.

Referring to FIG. 3A, in accordance with embodiments of the present invention, a layered substrate 300 comprises a substrate 310 having a layer of material 320 formed thereon. The substrate 310 may comprise a semiconductor, e.g., mono-crystalline silicon, germanium, and any other semiconductor. In alternate embodiments, substrate 310 may comprise any material used to fabricate integrated circuits, passive microelectronic devices (e.g., capacitors, inductors) and active microelectronic devices (e.g., transistors, photo-detectors, lasers, diodes). Substrate 310 may include insulating materials that separate such active and passive microelectronic devices from a conductive layer or layers that are formed on top of them. In one embodiment, substrate 310 comprises a p-type mono-crystalline silicon substrate that includes one or more insulating layers e.g., silicon dioxide, silicon nitride, sapphire, and other insulating materials.

As described above, the substrate 310 of the layered substrate 300 may comprise a film stack having one or more thin films or layers disposed between a base layer and the layer of material 320. Each thin film in substrate 310 may comprise a conductive layer, a non-conductive layer, or a semi-conductive layer. For instance, the thin film may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film may comprise a low dielectric constant (i.e., low-k) or ultra-low dielectric constant (i.e., ultra-low-k) dielectric layer having a nominal dielectric constant value less than the dielectric constant of SiO$_2$, which is approximately 4 (e.g., the dielectric constant for thermal silicon dioxide can range from 3.8 to 3.9). More specifically, the thin film may have a dielectric constant of less than 3.7, or a dielectric constant ranging from 1.6 to 3.7.

According to embodiments of the invention, the layer of material 320 may possess a chemical affinity for at least one polymer block of the block copolymer. By chemical affinity, in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. For instance, in the case of a di-block copolymer, the two different polymer blocks making up the block copolymer molecule are considered as two different chemical species having differing chemical affinities. Accordingly, the chemical species in the layer of material 320 may be the same as, or substantially similar to, one of the polymer blocks, and therefore possess a high affinity to the same. According to an embodiment, the layer of material 320 may comprise a cross-linkable polymer, which may be cross-linked prior to forming subsequent layers.

Referring further to FIG. 3A, a layer of a radiation sensitive material 330 is formed on the layer of material 320. In accordance with an embodiment of the present invention, the radiation sensitive material comprises a photo-decomposable cross-linking agent comprising a plurality of the first functional group (FG') covalently bonded to one another through a photo-decomposable functional group; and a cross-linkable polymer comprising a plurality of a second functional group (FG"), and wherein the second functional group (FG") reacts with the first functional group (FG') upon heating to or above a cross-linking reaction temperature to provide a cross-linked polymer.

According to an embodiment of the present invention, the photo-decomposable cross-linking agent is represented by a general formula (I):

$$\text{FG'-L}^1\text{-Q(-L}^2\text{-FG')}_m, \tag{I}$$

wherein FG' represents the first functional group selected from the group consisting of primary amines, secondary amines, hydroxyls, amides, esters, epoxies, episulfides, and anhydrides; wherein $L^1$ and $L^2$ are linking groups covalently bonding the first functional groups (FG') to Q; wherein Q is the photo-decomposable functional group; and wherein m is an integer from 1 to 3. In accordance with this embodiment, the photo-decomposable functional group Q is thermally-stable at the cross-linking reaction temperature, but decomposes upon exposure to a wavelength of patterned electromagnetic (EM) radiation 340 used for imaging the layer of the radiation sensitive material 330. Non-limiting examples of suitable photo-decomposable functional groups include those functional groups that are photolytically-cleaved in common photoacid generators, which include iodoniums or oxime sulfonates. Other suitable photo-decomposable functional groups include, but are not limited to, sulfoniums, N-hydroxyimide sulfonates, nitrobenzoate esters, nitrobenzoate sulfonate esters, or others functional groups disclosed in U.S. Pat. No. 6,855,476. An electron-rich olefin, such as 1,2-disubstituted ethylene group wherein the substitution is with sulfide moieties, is also a suitable photo-decomposable functional group.

Accordingly, upon photo-cleavage of the photo-decomposable functional group, the covalent bond connecting the plurality of the first functional groups (FG') is severed.

According to an embodiment, the photo-decomposable functional group Q is an iodonium moiety, such as that commonly found in a class of iodonium photo-acid generators (e.g., bis(4-t-butylphenyl) iodonium triflate). The iodonium moiety-containing photo-decomposable cross-linking agents are represented by a general formula (II):

$$FG'\text{-}L^1\text{-}I\text{-}L^2\text{-}FG'A^-, \qquad (II)$$

wherein FG' is defined above; wherein $L^1$ and $L^2$ are linking groups comprising substituted or unsubstituted aryls that covalently bond each FG' to the iodonium group ($I^+$); and A is an anion of a complex metal halide or a strong protonic acid. According to aspects of this embodiment, $L^1$ and $L^2$ may be the same or different, and may be independently selected from ortho-, meta-, para-substituted aryls. The substitution groups bonding the aryl group to the first functional group (FG') may be directly bonded to the aryl group through carbon, oxygen, nitrogen, sulfur, and/or silicon atoms. Exemplary substitution groups include, but are not limited to, a substituted or unsubstituted alkyl group having from 1 to 6 carbon atoms, such as ethyl, isopropyl, n-propyl, n-butyl, t-butyl, or t-pentyl; an alkoxy having from 2 to 6 carbon atoms, such as ethoxy, propoxy, or butoxy; $NH_2$; an alkyl amine having from 2 to 6 carbon atoms, such as ethylamine, propylamine, or butylamine; a polyethylene glycol chain; an alkyl sulfide; an alkyl sulfoxide; an alkyl sulfone; a siloxane chain; or combinations thereof.

According to aspects of this embodiment, anion ($A^-$) may be an anion of a complex metal halide, represented generally as $[MX_m]^-$, wherein M is a metal, such as boron, gallium, arsenic, phosphorus, and antimony; m is 4 or 6, and X is halogen. Examples include, but are not limited to, $[BF_4]^-$, $[PF_6]^-$, $[AsF_6]^-$, and $[SbF_6]^-$. Alternatively, X may be $C_6F_5$ when M is boron or gallium, and m is 4, i.e., $[B(C_6F_5)_4]^-$, or $[Ga(C_6F_5)_4]^-$. $A^-$ may instead be an anion from a strong protonic acid, e.g., $[ClO_4]^-$, $[CF_3SO_3]^-$, $[FSO_3]^-$, $[CH_3SO_3]^-$, or $[C_4F_9SO_3]^-$.

The photo-decomposable cross-linking agents of formula (II) can be synthesized in accordance with the general procedures described in Bielawski et al. J. Org. Chem., 2008, 73, 4602-4607, or U.S. Patent Application Publication No. 2002/0192619, for example. One exemplary iodonium photo-decomposable cross-linking agent having two hydroxyl groups as its first functional group is bis(4-(2-hydroxyethoxy)phenyl iodonium tetrafluoroborate (1), which may be synthesized by the m-chloroperbenzoic acid/boron trifluoride etherate mediated coupling of 4-(2-hydroxyethoxy)iodobenzene and 4-(2-hydroxyethoxy)phenyl boronic acid (Scheme 1).

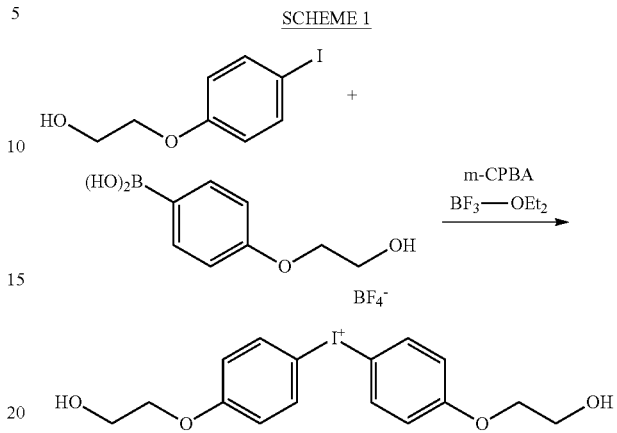

In another embodiment, the photo-decomposable functional group Q is a sulfonated oxime group, such as that commonly found in a class of non-ionic oxime sulfonate photo-acid generators (e.g., CIBA® IRGACURE® 263). The photo-decomposable cross-linking agents comprising the sulfonated oxime group are represented by a general formula (III):

$$[FG'\text{-}L^3\text{-}SO_2\text{-}O\text{-}N\text{=}CR^1]_n\text{-}Y \qquad (III)$$

wherein FG' is defined above; wherein $L^3$ is a linking group covalently bonding FG' to a sulfonyl ($SO_2$) group; wherein $R^1$ is a substituted or unsubstituted alkyl, a haloalkyl, a cycloalkyl, a heterocycle, an aryl, a heteroaryl, or an alkaryl; n is an integer greater than 1 in order to provide a plurality of first functional groups (FG'); and Y is a carbon-containing connecting member which covalently links the plurality of first functional groups with each other.

The photo-decomposable cross-linking agents of formula (III) can be synthesized in accordance with the general procedures described in U.S. Pat. Nos. 7,687,220 and 8,241,822, for example. One exemplary oxime sulfonate photo-decomposable cross-linking agent having two hydroxyl as its first functional group is compound (2):

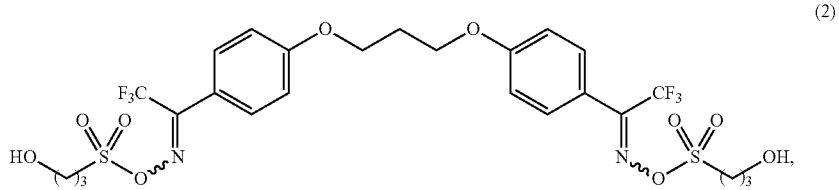

which may be synthesized by sulfonation of a bis-oximated diketone compound, derived from its corresponding bis(trifluoromethylphenyl ketone), with a hydroxyl-protected sulfonyl chloride, P—O—$CH_2CH_2CH_2SO_2Cl$, and followed by removal of the protecting group (P) to provide the diol-containing photo-decomposable cross-linking agent (2).

It should be appreciated that similar hydroxyl-protected sulfonyl chloride compounds are also suitable for preparing N-hydroxyimide sulfonates photo-decomposable cross-linking agents represented by a general formula (IV):

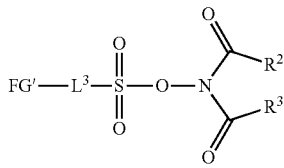

wherein FG' and $L^3$ are as defined above; wherein $R^2$ and $R^3$ may be the same or different, or in combination form a ring, so long as at least one of $R^2$ or $R^3$ comprises a second FG'. For example, wherein $R^2$ and $R^3$ can be the same or different carbon-containing moiety, or in combination form a carbon-containing ring, provided that at least one of $R^2$, $R^3$, or the carbon-containing ring is substituted with at least one FG'.

Sulfonation of an appropriately functionalized and/or protected N-hydroxyimide using the hydroxyl-protected sulfonyl chloride, P—O—CH$_2$CH$_2$CH$_2$SO$_2$Cl, which is followed by removal of the protecting group(s) provides the N-hydroxyimide sulfonates photo-decomposable cross-linking agents represented by the general formula (IV) above.

In another embodiment, the photo-decomposable functional group of the photo-decomposable cross-linking agent is a nitrobenzoate ester, which includes carboxylic acid esters or sulfonic acid esters. The photo-decomposable cross-linking agents comprising the nitrobenzoate ester group can be represented by a general formula (V):

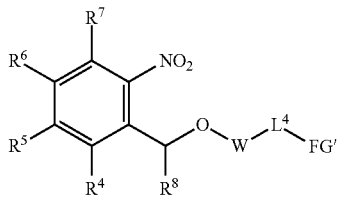

wherein FG' is defined above; wherein W is selected from a carbonyl (C=O) group or a sulfonyl (SO$_2$) group; wherein $L^4$ is a linking group covalently bonding FG' to W; and wherein $R^4$, $R^5$, $R^6$, $R^7$, and $R^8$ are independently selected from H; a halide; a substituted or unsubstituted alkyl, cycloalkyl, aryl, alkaryl, or ether groups; a haloalkyl; a heterocycle; a heteroaryl; an alkoxyl; or combinations thereof, with the proviso that at least one of $R^4$, $R^5$, $R^6$, $R^7$, and $R^8$ comprises a functional group selected from primary amines, secondary amines, hydroxyls, amides, esters, epoxies, episulfides, and anhydrides.

The photo-decomposable cross-linking agents of formula (V) can be synthesized in accordance with the general procedures described in U.S. Pat. No. 5,344,742 and references cited therein. Generally, a reaction between a benzyl alcohol and the appropriately-substituted acid chloride (ClOC-$L^4$-FG') or sulfonyl chloride (ClO$_2$S-$L^4$-FG') carried out in the presence of an organic amine or other suitable base in an organic solvent such as acetone or dimethylformamide provides the intended nitrobenzyl ester.

In another embodiment, the photo-decomposable functional group of the photo-decomposable cross-linking agent is a 1,2-disulfidylethylene group. The photo-decomposable cross-linking agents comprising the 1,2-disulfidylethylene group can be represented by a general formula (VI):

$$FG'-L^5-S—CR^9=CR^{10}—S-L^6-FG',\qquad(VI)$$

wherein FG' represents the first functional group selected from the group consisting of primary amines, secondary amines, hydroxyls, amides, esters, epoxies, episulfides, and anhydrides; wherein $L^5$ and $L^6$ are linking groups covalently bonding FG' to sulfur; and wherein $R^9$ and $R^{10}$ are independently selected from H, or substituted or unsubstituted carbon-containing chains and rings.

According to an embodiment, an exemplary bis-amine-terminated photo-decomposable cross-linking agent, H$_2$NCH$_2$CH$_2$SCHCHSCH$_2$CH$_2$NH$_2$, can be synthesized by conversion of cystamine to its N-t-butoxycarbonyl derivative, then reduction of the disulfide link with sodium in ammonia, and then followed by a reaction of the thiolate with cis-1,2-dichloroethylene to form the bis-protected disulfydylethylene compound, as disclosed in Ruebner, A. et. al., PNAS, Vol. 96, No. 26; Dec. 21, 1999; pp. 14692-14693. An acid-catalyzed deprotection of the N-t-butoxycarbonyl protecting group would provide the expected bis-amine terminated photo-decomposable cross-linking agent, H$_2$NCH$_2$CH$_2$SCHCHSCH$_2$CH$_2$NH$_2$.

It should be appreciated that the exemplary photo-decomposable cross-linking agents described above may be adapted to include other functional groups that would be complementary to the second functional groups (FG") of the cross-linkable polymer. Accordingly, the cross-linkable polymer component of the radiation sensitive material is not particularly limited to any specific type of polymer, but should possess a plurality of the second functional group (FG"), which are complementary to the first functional group (FG') in the desired cross-linking reaction. For example, polymers with pendant epoxy groups, which undergo acid-catalyzed cross-linking with hydroxyl-containing cross-linking agents, are suitable cross-linkable polymers. The radiation sensitive material may further comprise other components, such as acids, photo-acid generators, bases, photo-base generators, sensitizers, and can be formulated in a liquid as a solution or dispersion.

As shown in FIG. 3A, following the application of the layer of radiation-sensitive material 330 to the first layer of material 320, the layer of radiation-sensitive material 330 can be exposed to patterned electromagnetic (EM) radiation 340, which may be provided, for example, by a mask (not shown). Typical masks comprise opaque regions that prevent radiation from being transmitted to the layer of radiation-sensitive material 330 and transparent regions that transmit the radiation to the layer of radiation-sensitive material 330. The mask may include any mask suitable for use in wet (e.g., immersion) or dry lithography, including wavelengths ranging from about 365 nm to about 6.5 nm. The mask may include a binary mask or chrome on glass mask. Alternatively, the mask may include an alternating phase shift mask, or an embedded phase shift mask.

Figure 3B:
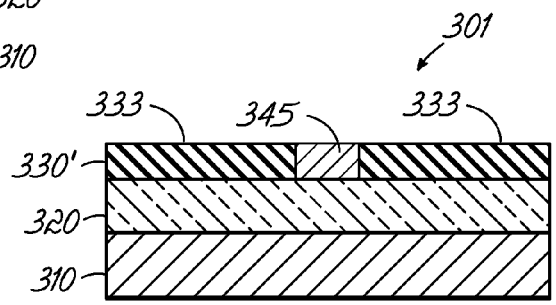

The exposure of the layer of the radiation-sensitive material 330 to patterned EM radiation 340 may be performed in a dry or wet photo-lithography system. The lithography system may be capable of providing a pattern of EM radiation at wavelengths of 365 nm, 248 nm, 193 nm, 157 nm, 13 nm, and 6.5 nm, for example. According to an embodiment of the present invention, the wavelength of the EM radiation is selected to correspond to the wavelength needed to decompose/degrade the photo-sensitive component of the radiation sensitive material. According to another embodiment of the present invention, the photo-sensitive component of the radiation sensitive material is designed so that the wavelength of the EM radiation provided by the available device is sufficient to decompose/degrade the photo-sensitive component. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). The mask can be illuminated, for example, with normal incident light and off-axis illumination light, such as annular illumination, quadrupole illumination, and dipole illumination. These methods of illumination and exposing the layer of radiation-sensitive material 330 to radiation using masks are known to one of ordinary skill in the art of microelectronic device manufacturing. As shown in FIG. 3B, exposing the layer of the radiation sensitive material 330 to patterned EM radiation 340 provides an imaged layer 330' having a pattern defined by an imaged region 345 having substantial portions of a decomposed photo-decomposable cross-linking agent surrounded by non-imaged regions 333 having substantial portions of intact photo-decomposable cross-linking agent.

Figure 3C:
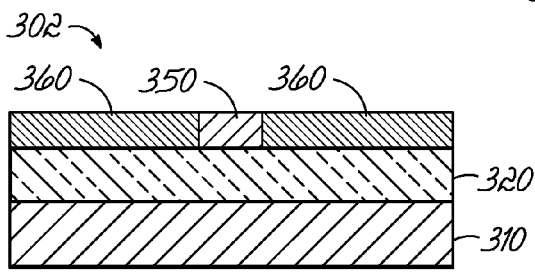

In reference to FIG. 3C, thermally treating the imaged layer 330' by heating the layered substrate 301 to or above a cross-linking temperature effects the cross-linking of the cross-linkable polymer by the intact photo-decomposable cross-linking agent in the non-imaged regions 333 to provide a cross-linked portion of radiation sensitive material 360, while the imaged region 345 forms a non-crosslinked region 350, which is not cross-linked because the photo-decomposable cross-linking agent has been decomposed. For example, a temperature of the layered substrate 301 may be elevated to a cross-linking reaction temperature between about 50° C. and about 200° C., for a duration of about 30 seconds to about 180 seconds. A track system having substrate heating and cooling equipment may be used to perform the thermal treatment, for example, one of the track systems described above. Other systems and methods for thermally treating an exposed radiation-sensitive material film on a substrate are well known to those skilled in the art.

Based on the intrinsic nature of the photo-decomposable cross-linking agent, it should be appreciated that the layer of the radiation-sensitive material 330 may be thermally treated in a post-application bake (PAB) and cross-linked prior to imaging. In this alternative embodiment (not shown), the layered substrate 300 is heated to or above a cross-linking temperature before exposing the radiation sensitive material to the patterned EM radiation 340 to provide a single cross-linked layer. However, upon exposure to patterned EM radiation 340, the decomposition of the photo-decomposable functional group severs the cross-linking bridge between the polymers in the imaged region, thereby providing a complementary approach to that described above.

As used herein, positive-tone developing chemistry refers to a solvent system that selectively removes the non-crosslinked region 350 having a high radiation exposure. Common positive-tone developing solvent systems include a base, e.g., alkali, amines, etc. In one embodiment, the positive-tone developing chemistry to selectively remove the imaged region 345 includes tetramethylammonium hydroxide (TMAH). In another embodiment, the positive-tone developing chemistry to selectively remove the non-crosslinked region 350 includes a base, water, and an optional surfactant.

Figure 3D:
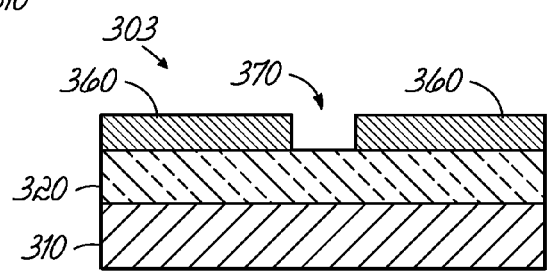

In reference to FIGS. 3C and 3D, the layered substrate 302 having the non-crosslinked region 350 is brought into contact with a development solution containing the positive-tone developing chemistry to remove the non-crosslinked region 350 that is soluble in the positive-tone developing chemistry to provide feature 370 thereby exposing the underlying first layer of material 320. Thereafter, the layered substrate 303 is dried. The developing process may be performed for a pre-specified time duration (e.g., about 30 seconds to about 180 seconds), at a pre-specified temperature (e.g., room temperature), and at a pre-specified pressure (e.g., atmospheric pressure). The developing process can include exposing the substrate to a developing solution in a developing system, such as a track system, for example, the track systems described above.

Figure 3E:
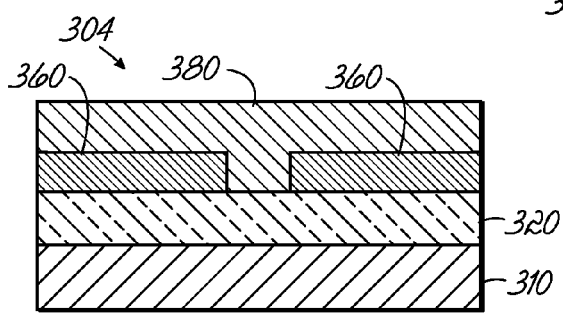

With reference to FIG. 3E, a layer of the block copolymer 380 is next applied and allowed to self-assemble to form a mask pattern over the exposed first layer of material 320 and the cross-linked portion of radiation sensitive material 360. The block copolymer comprises at least two polymer blocks, which may be selectively etched relative to one another, i.e., the block copolymer has an etch selectivity greater than 2 under a first set of etching conditions. Furthermore, the block copolymer can self-organize in a desired and predictable manner, e.g., the polymer blocks are immiscible and will segregate under appropriate conditions to form domains predominantly containing a single block species.

The block copolymers may be deposited by various methods, including, e.g., spin-on coating, spin casting, brush coating or vapor deposition. For example, the block copolymer may be provided as a solution in a carrier solvent such as an organic solvent, e.g., toluene. The solution of the block copolymer can be applied to the layered structure shown in FIG. 3D and the carrier solvent subsequently removed to provide the layer of block copolymer 380.

While the invention is not bound by theory, it will be appreciated that the different block species are understood to self-aggregate due to thermodynamic considerations in a process similar to the phase separation of materials. The self-organization is guided by the physical interfaces of the feature 370, as well as the chemical affinity between the chemical species of the underlying first layer of material 320 and at least one of the polymer blocks within the block copolymer chain. Accordingly, the constituent blocks of the block copolymers can orient themselves along the length of the cross-linked portion of radiation sensitive material 360 due to interfacial interactions and chemical affinities.

Figure 3F:
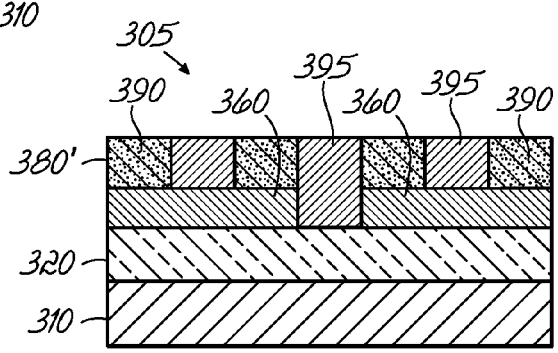

With continued reference to the layered structures 304 and 305 shown in FIGS. 3E and 3F, respectively, the layer of the block copolymer 380 is exposed to annealing conditions to facilitate the self-assembly of the block copolymer into a plurality of alternating domains 390, 395 aligned side-by-side between the spaced cross-linked portions of radiation sensitive material 360. In this exemplary embodiment, shown in FIG. 3F, the layer of self-assembled block polymer 380' has domains 390, 395 that are arranged where the first layer of material 320 has a chemical affinity for the polymer block comprising domain 395. Accordingly, the chemical affinity between one of the polymer blocks of the block copolymer and the first layer of material 320 acts to pin the domain 395 into the feature 370. Conversely, if the chemical affinity is neutral between the cross-linked portion of the radiation sensitive material 360 and the polymer blocks of the block copolymer, both domains 390, 395 may self-organize across this neutral surface, which advantageously provides frequency multiplication. In the embodiment shown in FIG. 3F, a 3× frequency multiplication is shown. It should be appreciated that other frequency multiplications may be obtained ranging from 1×-10×. In the case of 1× frequency multiplication, the neutral layer can also be made chemically attractive to the block that comprises domain 390 and so further increase the chemical driving force for assembly.

It should be appreciated that the dimension of the pinning region (e.g., the dimension of feature 370 in the instant embodiment) can be designed to correlate to the $L_0$ of the self-assembled block copolymer morphology. If the pinning region is about $L_0/2$, it will effectively match the size of one of the blocks of the block copolymer. Pinning regions of about $3L_0/2$ will also effectively serve to pin one of the blocks of the block copolymer. Accordingly, according to one aspect of the present invention, the method also includes preparing a feature having a dimension that is in a range from about 0.30 $L_0$ to about 0.9 $L_0$; or from about 1.25 $L_0$ to about 1.6 $L_0$.

The self-organization may be facilitated and accelerated by annealing the layered structure 304 shown in FIG. 3E. The temperature of the annealing process may be chosen to be sufficiently low to prevent adversely affecting the block copolymers or the layered structure. The anneal may be performed at a temperature of less than about 350° C., less than about 300° C., less than about 250° C., less than about 200° C. or about 180° C. in some embodiments. According to another embodiment, the annealing process may include a solvent anneal, which generally reduces the annealing temperature. Traditional solvent annealing methods can be used, as well as newer techniques such as that disclosed in U.S. patent application Ser. No. 13/843,122, filed on Mar. 15, 2013 entitled NOVEL SOLVENT ANNEAL PROCESSING FOR DIRECTED-SELF ASSEMBLY APPLICATIONS, which is incorporated herein by reference in its entirety.

According to one aspect, in order to facilitate faster annealing times without oxidizing or burning the organic polymer block of the block copolymer, the annealing may be performed in a low oxygen atmosphere at annealing temperature greater than about 250° C. in less than about 1 hour of anneal time. As used herein, the low oxygen atmosphere comprises less than about 50 ppm oxygen. For example, the low oxygen atmosphere may include less than about 45 ppm, less than about 40 ppm, less than about 35 ppm, less than about 30 ppm, less than about 25 ppm, less than about 20 ppm, or ranges in between thereof. Additionally, the low oxygen atmosphere annealing methods may be accompanied by thermal quenching methods. Exemplary low oxygen atmosphere and thermal quenching annealing methods are disclosed in U.S. Patent Application Ser. No. 61/793,204, filed on Mar. 15, 2013 entitled MULTI-STEP BAKE APPARATUS AND METHOD FOR DIRECTED SELF-ASSEMBLY LITHOGRAPHY CONTROL, which is incorporated herein by reference in its entirety.

The anneal time may range from about several hours to about 1 minute. For example, annealing times for temperatures above 250° C. may range from about 1 hour to about 2 minutes, from about 30 minutes to about 2 minutes, or from about 5 minutes to about 2 minutes.

According to one embodiment, the annealing temperature may be within the range from about 260° C. to about 350° C., wherein the low oxygen atmosphere comprises less than about 40 ppm oxygen. For example, the layer of the block copolymer 380 may be exposed to annealing conditions of 310° C. in less than about 40 ppm oxygen for about a 2 minutes to about 5 minutes.

Accordingly, the annealing step of the layer of block copolymer 380 forms a layer of self-assembled block polymer 380' having a first domain 390 that is formed of one polymer block, and sandwiched by domains 395 that are formed of another block polymer. Further, based on the intrinsic etch selectivity provided by the choice of the appropriate polymer blocks, it will be appreciated that one of the domains may be selectively removed in a single step using a single etch chemistry or may be removed using multiple etches with different etch chemistries.

For example, where the domains 390 are formed of polystyrene (PS) and the domain 395 is formed of polymethyl (meth)acrylate (PMMA), the PMMA domain 395 may be removed by performing a selective oxygen plasma etch, which also partially oxidizes the PS domain features 390, which remain. It will be appreciated that the dimensions of the resulting features may vary, depending on the size of the copolymer used and process conditions. It should be further appreciated that domain phases other than the lamellar phases shown in FIG. 3F are also contemplated, and therefore the present invention is not limited thereto.

(b) Photo-Base Generator

Figure 4:
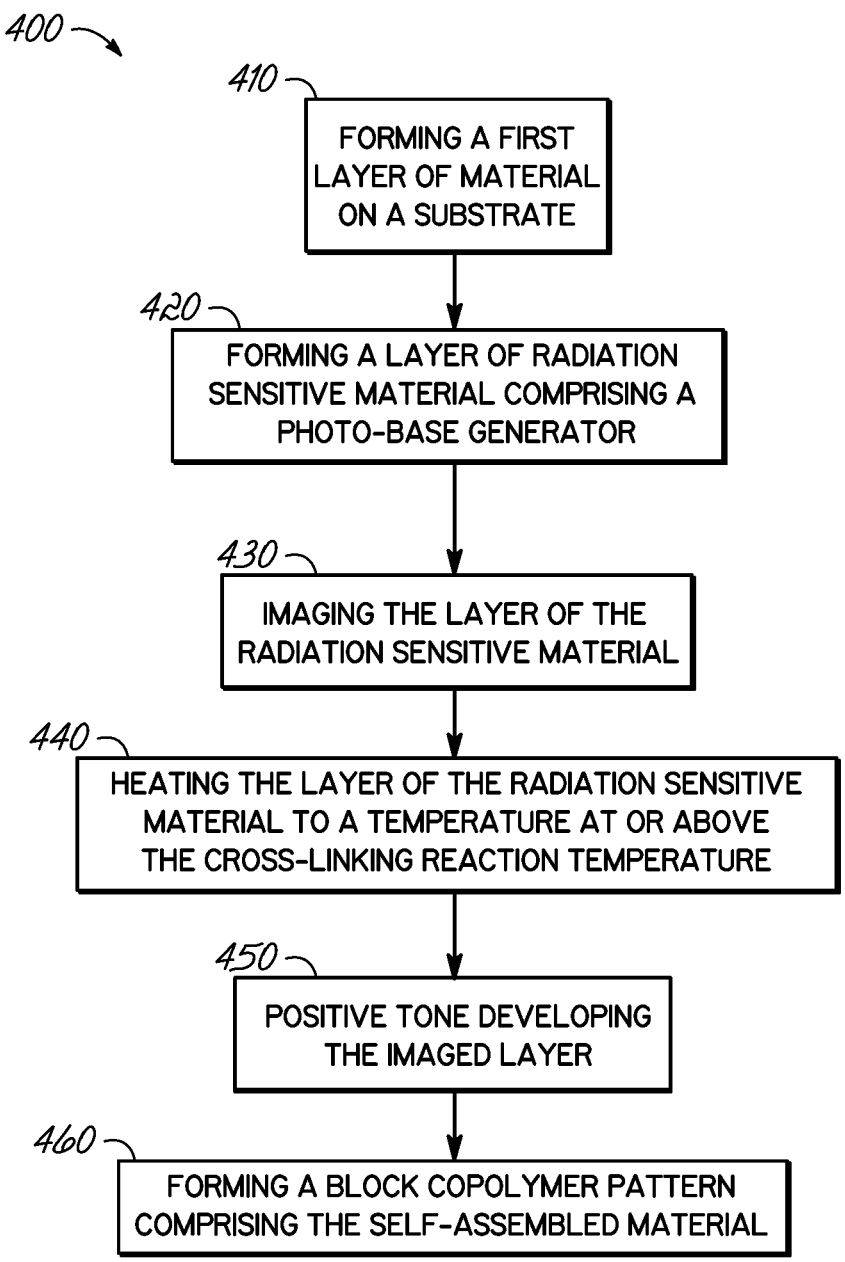
FIG. 4 is a flow chart illustrating a method for forming a layered substrate comprising a self-assembled material utilizing a photo-base generator, in accordance with another embodiment of the invention.

In accordance to another embodiment of the present invention, the photo-sensitive component is a photo-base generator, which is suitable for use in photolithographic applications. Referring to FIG. 4, in accordance with another embodiment of the present invention, a method 400 for forming a layered substrate comprising a self-assembled material is provided, comprising forming a first layer of material on a substrate in 410; forming a layer of a radiation sensitive material on the first layer of material in 420; imaging the layer of the radiation sensitive material with patterned light to form a pattern in the layer of radiation sensitive material in 430; heating the layer of the radiation sensitive material to a temperature at or above the cross-linking reaction temperature in 440; positive-tone developing the imaged layer in 450; and forming a block copolymer pattern comprising the self-assembled material in 460. The radiation sensitive material comprises a photo-base generator, an acidic compound, a cross-linking agent, and a cross-linkable polymer, wherein imaging by the patterned light provides a pattern defined by a first region having substantial portions of a decomposed photo-base generator surrounded by regions having substantial portions of intact photo-base generator.

As noted, the radiation sensitive material of the embodiment shown in FIGS. 5A-5F also contains a photo-base generator compound and an acidic compound. The photo-base generator decomposes (e.g., undergoes photocleavage) to provide a base upon exposure to activating radiation. A photo-base generator typically will be a neutral compound that generates base (e.g., an organic base such as an amine) upon photo-activation. The photo-base generator should be present in a composition of the invention in an amount sufficient to enable the neutralization of the acidic compound in the layer of radiation sensitive material following exposure of the same to activating radiation. A variety of base generator compounds will be suitable for use in the compositions of the invention. Suitable base generators include organic compounds, for example, photoactive carbamates, including benzyl carbamates and benzoin carbamates. Other suitable organic base generators include O-carbamoylhydroxylamines, O-carbamoyloximes, aromatic sulfonamides, alpha-lactams, amides such N-(2-arylethyenyl)amides, and other amides.

The cross-linking agent, which comprises a plurality of first functional groups (FG'), and the cross-linkable polymer, which comprises a plurality of second functional groups (FG") are selected so as to provide complementary reactants to an acid-catalyzed cross-linking reaction. Accordingly, the acidic compound, also present in the radiation sensitive material, serves as a catalyst to the intended cross-linking reaction. The acidic compound is present in the radiation sensitive material in a sufficient quantity to effect the cross-linking of the cross-linkable polymer upon heating to or above the cross-linking reaction temperature.

Figure 5A:
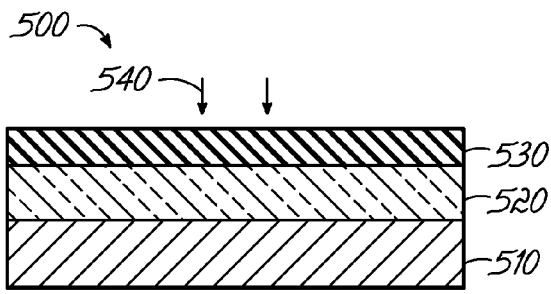
FIGS. 5A through 5F illustrate a positive-tone lithographic patterning and directed self-assembly technique, in accordance with the method illustrated in FIG. 4.

Referring to FIG. 5A, in accordance with embodiments of the present invention, a layered substrate 500 comprises a substrate 510 having a layer of material 520 formed thereon. A layer of the radiation sensitive material 530 is formed on the layer of material 520. Following the application of the layer of radiation-sensitive material 530 to the first layer of material 520, the layer of radiation-sensitive material 530 can be exposed to patterned electromagnetic (EM) radiation 540, which may be provided, for example, by a mask (not shown). As noted above, the mask may include any mask suitable for use in wet (e.g., immersion) or dry lithography, including wavelengths ranging from about 365 nm to about 6.5 nm. The mask may include a binary mask or chrome on glass mask. Alternatively, the mask may include an alternating phase shift mask, or an embedded phase shift mask.

Figure 5B:
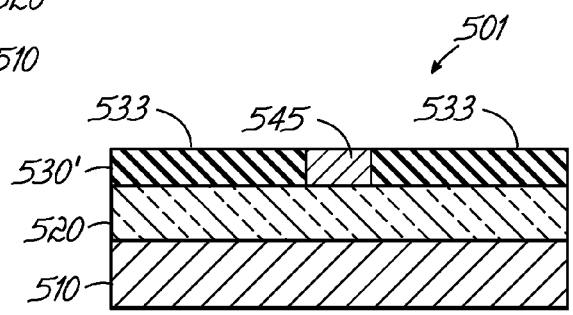

The exposure of the layer of the radiation-sensitive material 530 to patterned EM radiation 540 may be performed in a dry or wet photo-lithography system. The lithography system may be capable of providing a pattern of EM radiation at wavelengths of 365 nm, 248 nm, 193 nm, 157 nm, 13 nm, and 6.5 nm, for example. According to an embodiment of the present invention, the wavelength of the EM radiation is selected to correspond to the wavelength needed to decompose/degrade the photo-base generator component of the radiation sensitive material. According to another embodiment of the present invention, the photo-sensitive component of the radiation sensitive material is designed so that the wavelength of the EM radiation provided by the available device is sufficient to decompose/degrade the photo-sensitive component. The image pattern can be formed using any suitable conventional stepping lithographic system, or scanning lithographic system. The method of illumination and exposing the layer of radiation-sensitive material 530 to EM radiation using masks are known to one of ordinary skill in the art of microelectronic device manufacturing. As shown in FIG. 5B, exposing the layer of the radiation sensitive material 530 to patterned EM radiation 540 provides an imaged layer 530' having a pattern defined by an imaged region 545 having substantial portions of a decomposed photo-base generator surrounded by non-imaged regions 533 having substantial portions of intact photo-base generator.

Figure 5C:
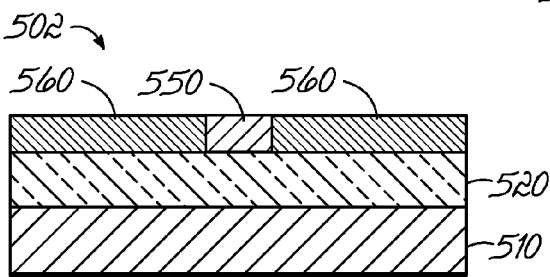

In reference to FIG. 5C, thermally treating the imaged layer 530' by heating the layered substrate 501 to or above a cross-linking temperature effects the cross-linking of the cross-linkable polymer by the cross-linking agent in the non-imaged regions 533 to provide a cross-linked portion of radiation sensitive material 560, while the imaged region 545 forms a non-crosslinked region 550, which is not cross-linked because the acid catalyst necessary to effect the intended cross-linking reaction has been neutralized by the base generated from the photo-decomposition of the photo-base generator. Depending on factors, such as the nature of the functional groups and the amount of acidic compound present in the radiation sensitive material, a temperature of the layered substrate 501 may be elevated to a cross-linking reaction temperature between about 50° C. and about 200° C., for a duration of about 30 seconds to about 180 seconds.

It should be further appreciated that the cross-linking agent present in the embodiment shown in FIGS. 5A-5F may be the photo-decomposable cross-linking agent, as described above.

Figure 5D:
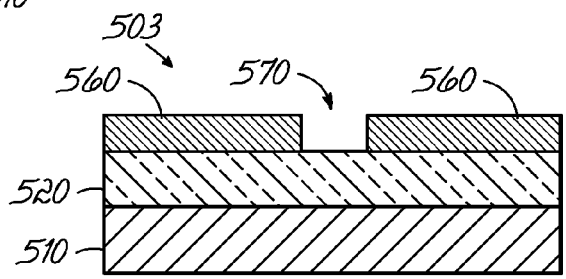

In reference to FIGS. 5C and 5D, the layered substrate 502 having the non-crosslinked region 550 is brought into contact with a development solution containing the positive-tone developing chemistry to remove the non-crosslinked region 550 that is soluble in the positive-tone developing chemistry to provide feature 570 thereby exposing the underlying first layer of material 520. Thereafter, the developed layered substrate 503 is dried. The developing process may be performed for a pre-specified time duration (e.g., about 30 seconds to about 180 seconds), at a pre-specified temperature (e.g., room temperature), and at a pre-specified pressure (e.g., atmospheric pressure). The developing process can include exposing the substrate to a developing solution in a developing system, such as a track system.

Figure 5E:
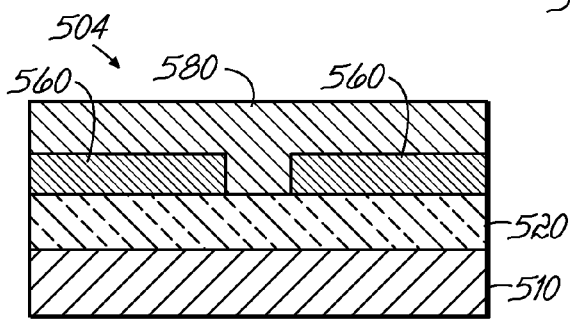

With reference to FIG. 5E, a layer of the block copolymer 580 is next applied and allowed to self-assemble to form a mask pattern over the exposed first layer of material 520 and the cross-linked portion of radiation sensitive material 560. The block copolymer comprises at least two polymer blocks, which may be selectively etched relative to one another, i.e., the block copolymer has an etch selectivity greater than 2 under a first set of etching conditions. Furthermore, the block copolymer can self-organize in a desired and predictable manner, e.g., the polymer blocks are immiscible and will segregate under appropriate conditions to form domains predominantly containing a single block species.

Figure 5F:
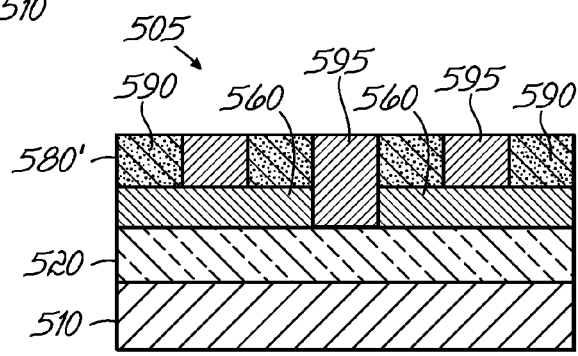

With continued reference to the layered structures 504 and 505 shown in FIGS. 5E and 5F, respectively, the layer of the block copolymer 580 is exposed to annealing conditions to facilitate the self-assembly of the block copolymer into a plurality of alternating domains 590, 595 aligned side-by-side between the spaced cross-linked portions of radiation sensitive material 560. In this exemplary embodiment, shown in FIG. 5F, the layer of self-assembled block polymer 580' has domains 590, 595 that are arranged where the first layer of material 520 has a chemical affinity for the polymer block comprising domain 595. Accordingly, the chemical affinity between one of the polymer blocks of the block copolymer and the first layer of material 520 acts to pin the domain 595 into the feature 570. Conversely, if the chemical affinity is neutral between the cross-linked portion of the radiation sensitive material 560 and the polymer blocks of the block copolymer, both domains 590, 595 may self-organize across this neutral surface, which advantageously provides frequency multiplication. In the embodiment shown in FIG. 5F, a 3× frequency multiplication is shown. As above, it should be appreciated that other frequency multiplications may be obtained ranging from 1×-10×. In the case of 1× frequency multiplication, the neutral layer can also be made chemically attractive to the block that comprises domain 590 and so further increase the chemical driving force for assembly The self-organization may be facilitated and accelerated by annealing the layered structure shown in FIG. 5E. The temperature of the annealing process may be chosen to be sufficiently low to prevent adversely affecting the block copolymers or the layered structure. The anneal may be performed as described above.

Additionally, based on the intrinsic etch selectivity provided by the choice of the appropriate polymer blocks, it will be appreciated that one of the domains may be selectively removed in a single step using a single etch chemistry or may be removed using multiple etches with different etch chemistries.

(c) Photo-Decomposable Base

Figure 6:
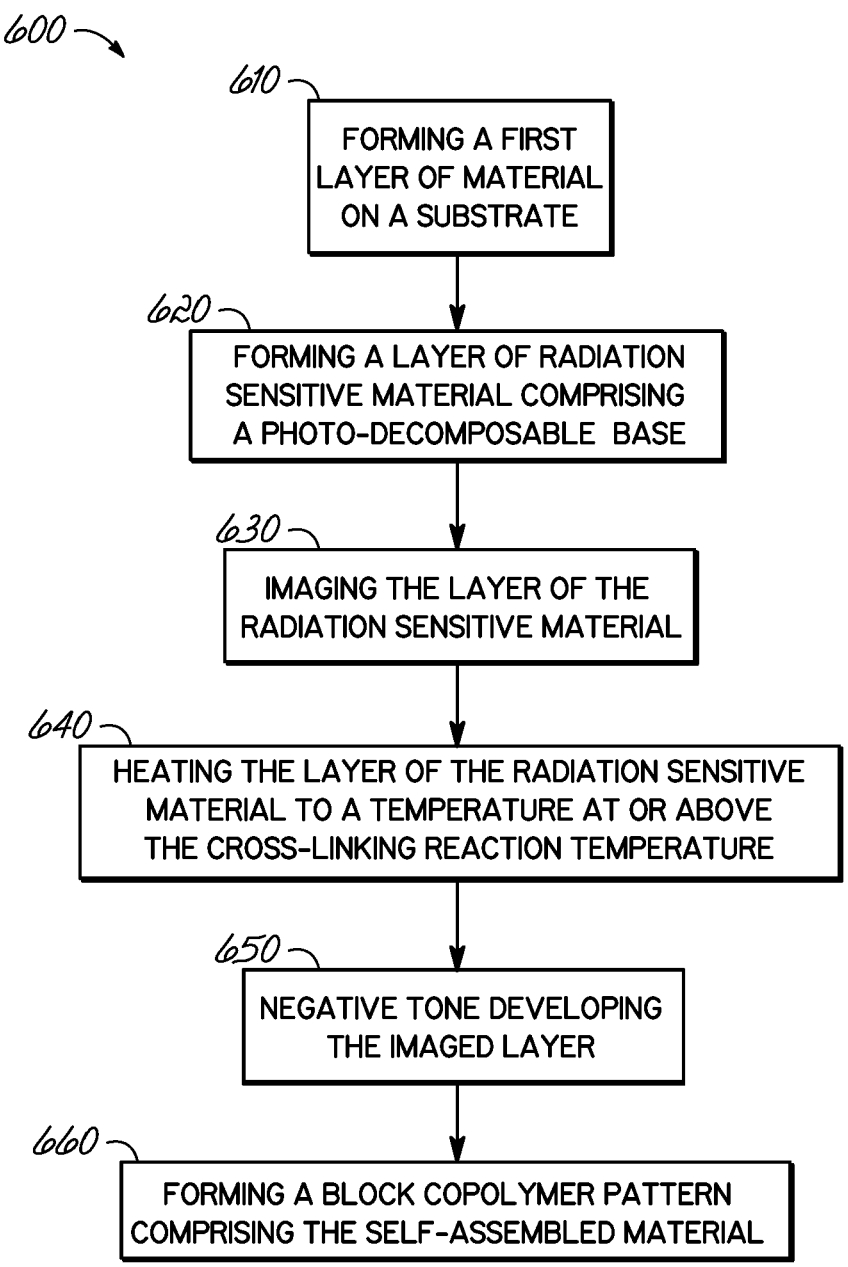
FIG. 6 is a flow chart illustrating a method for forming a layered substrate comprising a self-assembled material utilizing a photodegradable base, in accordance with another embodiment of the invention.

In accordance to another embodiment of the present invention, the photo-sensitive component is a photo-decomposable base, which is suitable for use in photolithographic applications. Referring to FIG. 6, in accordance with embodiments of the present invention, a method 600 for forming a layered substrate comprising a self-assembled material is provided, comprising forming a first layer of material on a substrate in 610; forming a layer of a radiation sensitive material on the first layer of material in 620; imaging the layer of the radiation sensitive material with patterned light to form a pattern in the layer of radiation sensitive material in 630; heating the layer of the radiation sensitive material to a temperature at or above the cross-linking reaction temperature in 640; performing a negative-tone developing the imaged layer in 650; and forming a block copolymer pattern comprising the self-assembled material in 660. The radiation sensitive material comprises a photo-decomposable base, an acidic compound, a cross-linking agent, and a cross-linkable polymer, wherein imaging by the patterned light provides a pattern defined by a first region having substantial portions of a decomposed photo-decomposable base surrounded by regions having substantial portions of intact photo-decomposable base.

As noted, the radiation sensitive material of the embodiment shown in FIGS. 7A-7F also contains a photo-decomposable base and an acidic compound, which serve to effectively provide a chemically neutral (in terms of its acidity-basicity nature) layer. It should be appreciated that the photo-decomposable base comprises a basic component, which upon exposure to activating radiation, the photo-decomposable base decomposes (e.g., undergoes photocleavage) to generate acid that neutralizes the basic component. The net effect of the decomposition of the photo-decomposable base is that the exposed region of radiation sensitive material is rendered chemically acidic. According to the embodiment shown in FIGS. 7A-7F, the cross-linking reaction between the cross-linking agent and the cross-linkable polymer is catalyzed by acid upon heating to or above the cross-linking reaction temperature, and thus the cross-linkable polymer in the exposed region undergoes cross-linking.

Thus, in accordance with an embodiment, the photo-decomposable base comprises a acid-generator component and a conjugate base of a weak acid component, which may be ionically paired or covalently bonded. As used herein, the acid generator component, is photodecomposable and includes photosensitive groups, such as iodoniums or sulfoniums. Non-limiting examples of iodonium groups include diaryl iodonium moieties such as diphenyliodonium; bis-(4-tert-butylphenyl) iodonium; or 4-methylphenyl[4-(1-methylethyl)phenyl)iodonium. Non-limiting examples of sulfonium groups include triaryl sulfonium moieties such as triphenylsulfonium, or tris-(4-tert-butylphenyl)sulfonium.

Non-limiting examples of the conjugate bases of weak acids suitable for the photo-decomposable bases of the present invention include carboxylates, such as acetate, benzoate, or oxalate; phenoxides; hydroxides, alkoxides, or halogenated alkoxides, such as 2,2,2-trifluorethanol. Skilled artisans in the art of photolithography will appreciated that sulfonic acids are strong acids, and therefore are excluded. Accordingly, sulfonates, such as alkylsulfonates, arylsulfonates, trifluoromethylsulfonate, perfluoro-1-butanesulfonate, and perfluo-1-octanesulfonate are not suitable conjugate base components of the photo-decomposable base. Similarly, other anions commonly found in classic ionic photo-acid generators, such as hexafluoroantimonate ($[SbF_6]^-$) and tetrakis-(pentafluorophenyl)borate are also excluded.

Exemplary photo-decomposable bases include, but are not limited to carboxylate, phenoxide, alkoxide, halogenated alkoxide, or hydroxide salts of trialkylsulfonium, triphenylsulfonium, tris(tert-butylphenyl)sulfonium, diphenyliodonium; bis-(4-tert-butylphenyl)iodonium; or 4-methylphenyl[4-(1-methylethyl)phenyl)iodonium. For example, one suitable photo-decomposable base is trimethylsulfonium hydroxide.

The cross-linking agent, which comprises a plurality of first functional groups (FG'), and the cross-linkable polymer, which comprises a plurality of second functional groups (FG"), are selected so as to provide complementary reactants to an acid-catalyzed cross-linking reaction. Accordingly, the acidic compound, also present in the radiation sensitive material, serves as a catalyst to the intended cross-linking reaction. The acidic compound, which is effectively regenerated by the decomposition of the photo-decomposable base, is present in the radiation sensitive material in a sufficient quantity to effect the cross-linking of the cross-linkable polymer in the imaged regions upon heating to or above the cross-linking reaction temperature.

Figure 7A:
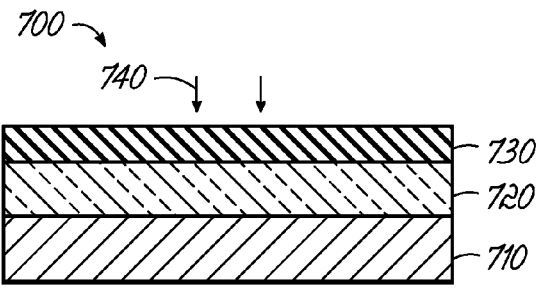
FIG. 7A through 7F illustrate a negative-tone lithographic patterning and directed self-assembly technique, in accordance with the method illustrated in FIG. 6.

Referring to FIG. 7A, in accordance with embodiments of the present invention, a layered substrate 700 comprises a substrate 710 having a layer of material 720 formed thereon. A layer of the radiation sensitive material 730 is formed on the layer of material 720. Following the application of the layer of radiation-sensitive material 730 to the first layer of material 720, the layer of radiation-sensitive material 730 can be exposed to patterned electromagnetic (EM) radiation 740, which may be provided, for example, by a mask (not shown).

Figure 7B:
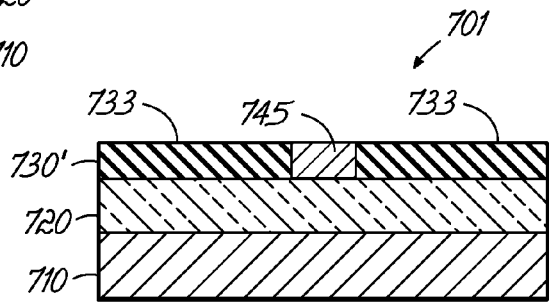

The exposure of the layer of the radiation-sensitive material 730 to patterned EM radiation 740 may be performed in a dry or wet photo-lithography system. The lithography system may be capable of providing a pattern of EM radiation at wavelengths of 365 nm, 248 nm, 193 nm, 157 nm, 13 nm, and 6.5 nm, for example. According to an embodiment of the present invention, the wavelength of the EM radiation is selected to correspond to the wavelength needed to decompose/degrade the photo-decomposable base component of the radiation sensitive material. According to another embodiment of the present invention, the photo-sensitive component of the radiation sensitive material is designed so that the wavelength of the EM radiation provided by the available device is sufficient to decompose/degrade the photo-sensitive component. The image pattern can be formed using any suitable conventional stepping lithographic system, or scanning lithographic system. The method of illumination and exposing the layer of radiation-sensitive material 730 to EM radiation using masks are known to one of ordinary skill in the art of microelectronic device manufacturing. As shown in FIG. 7B, exposing the layer of the radiation sensitive material 730 to patterned EM radiation 740 provides an imaged layer 730' having a pattern defined by an imaged region 745 having substantial portions of a decomposed photo-decomposable base surrounded by non-imaged regions 733 having substantial portions of intact photo-decomposable base.

Figure 7C:
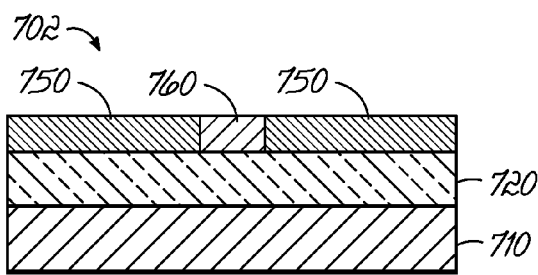

In reference to FIG. 7C, thermally treating the imaged layer 730' by heating the layered substrate 701 to or above a cross-linking temperature effects the cross-linking of the cross-linkable polymer by the cross-linking agent in the imaged region 745 to provide a cross-linked portion of radiation sensitive material 760, while the non-imaged regions 733 form non-crosslinked regions 750, which remain so because the acid catalyst necessary to effect the cross-linking reaction had been previously neutralized by the base component of the photo-decomposable base.

Figure 7D:
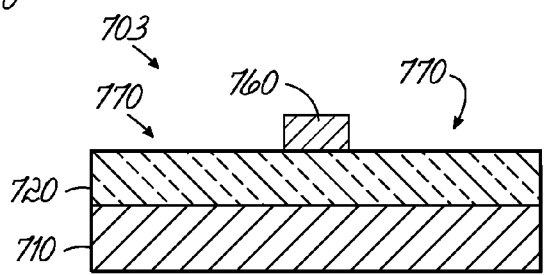

In reference to FIGS. 7C and 7D, the layered substrate 702 having the non-crosslinked region 750 is brought into contact with a development solution containing a negative-tone developing chemistry to remove the non-crosslinked region 750 that is soluble in the negative-tone developing chemistry to provide cross-linked feature 770 thereby exposing the underlying first layer of material 720. As used herein, negative-tone developing chemistry refers to a solvent system that selectively removes the non-crosslinked region 350 having a low radiation exposure. Common negative tone developing solvent systems includes organic solvents. In one embodiment, the negative-tone developing chemistry to selectively remove the imaged region 350 includes an organic solvent, such as that used to form the layer of radiation-sensitive material 730. Thereafter, the developed layered substrate 703 is dried. The developing process may be performed for a pre-specified time duration (e.g., about 30 seconds to about 180 seconds), at a pre-specified temperature (e.g., room temperature), and at a pre-specified pressure (e.g., atmospheric pressure). The developing process can include exposing the substrate to a developing solution in a developing system, such as a track system.

Figure 7E:
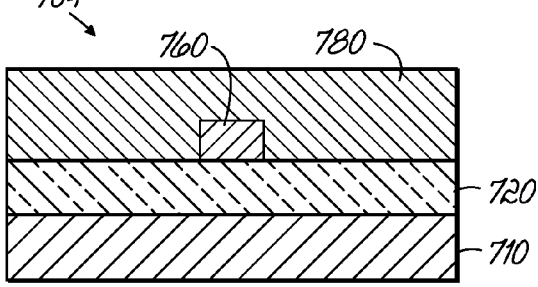

With reference to FIG. 7E, a layer of block copolymer 780 is next applied and allowed to self-assemble to form a mask pattern over the exposed first layer of material 720 and the cross-linked portion of radiation sensitive material 760. The block copolymer comprises at least two polymer blocks, which may be selectively etched relative to one another, i.e., the block copolymer has an etch selectivity greater than 2 under a first set of etching conditions. Furthermore, the block copolymer can self-organize in a desired and predictable manner, e.g., the polymer blocks are immiscible and will segregate under appropriate conditions to form domains predominantly containing a single block species.

Figure 7F:
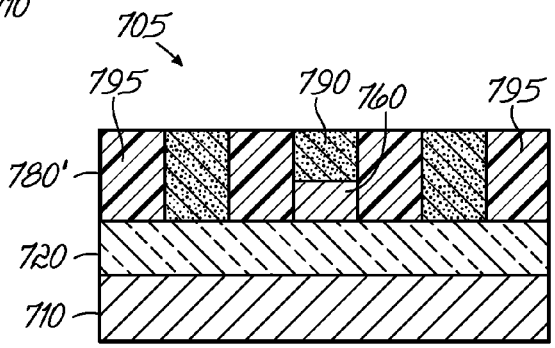

With continued reference to the layered structures 704 and 705 shown in FIGS. 7E and 7F, respectively, the layer of the block copolymer 780 is exposed to annealing conditions to facilitate the self-assembly of the block copolymer into a plurality of alternating domains 790, 795 aligned side-by-side along the span of the first layer of material on either side of the cross-linked portion of radiation sensitive material 760. In this exemplary embodiment, shown in FIG. 7F, the layer of self-assembled block polymer 780' has domains 790, 795 that are arranged where the cross-linked portion of the radiation sensitive material 760 has a chemical affinity for the polymer block comprising domain 790. Accordingly, the chemical affinity between one of the polymer blocks of the block copolymer and the cross-linked portion 760 acts to pin the domain 790 to the cross-linked portion 760. Conversely, if the chemical affinity is neutral between the first layer of material 360 and the polymer blocks of the block copolymer, both domains 790, 795 may self-organize across this neutral surface, which advantageously provides frequency multiplication. In the embodiment shown in FIG. 7F, a 3× frequency multiplication is shown. As above, it should be appreciated that other frequency multiplications may be obtained ranging from 1×-10×. For example, in the case of 1× frequency multiplication, the neutral layer can also be made chemically attractive to the block that comprises domain 795 and so further increase the chemical driving force for assembly The self-organization may be facilitated and accelerated by annealing the layered structure shown in FIG. 7E. The temperature of the annealing process may be chosen to be sufficiently low to prevent adversely affecting the block copolymers or the layered structure. The anneal may be performed as previously described above.

Additionally, based on the intrinsic etch selectivity provided by the choice of the appropriate polymer blocks, it will be appreciated that one of the domains may be selectively removed in a single step using a single etch chemistry or may be removed using multiple etches with different etch chemistries.

While the present invention has been illustrated by a description of one or more embodiments thereof and while these embodiments have been described in considerable detail, they are intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of forming a layered substrate comprising a self-assembled material, comprising:
    forming a first layer of material on a substrate;
    forming a layer of a radiation sensitive material on the first layer of material, the radiation sensitive material comprising a photo-sensitive component comprising a photo-decomposable cross-linking agent; and a cross-linkable polymer;
    imaging the layer of the radiation sensitive material with patterned light to form a pattern in the layer of the radiation sensitive material, wherein the pattern is defined by a first region having substantial portions of the photo-decomposable cross-linking agent decomposed, and a second region having substantial portions of the photo-decomposable cross-linking agent intact;
    heating the layer of the radiation sensitive material to a temperature at or above the cross-linking reaction temperature to cross-link the cross-linkable polymer in one of the first or second regions to form a cross-linked region, while the other one of the first or second regions remains as a non-crosslinked region;
    developing the imaged layer to remove the non-crosslinked region; and
    forming a block copolymer pattern comprising the self-assembled material derived from a block copolymer.

2. The method of claim 1, wherein at least one polymer block of the block copolymer has a chemical affinity for the first layer of material or the cross-linked region of the radiation sensitive material.

3. The method of claim 1,
    wherein the photo-decomposable cross-linking agent comprises a plurality of a first functional group (FG') covalently bonded to one another through a photo-decomposable functional group;
    wherein the cross-linkable polymer of the radiation sensitive material comprises a plurality of a second functional group (FG"), wherein the second functional group (FG") reacts with the first functional group (FG') upon the heating to the temperature at or above the cross-linking reaction temperature;
    and
    wherein the developing is a positive-tone development.

4. The method of claim 3, wherein the photo-decomposable cross-linking agent is defined by a general formula (I) of:

wherein FG' represents the first functional group selected from primary amines, secondary amines, hydroxyls, amides, esters, epoxies, episulfides, or anhydrides; L' and L" represent linking groups covalently bonding the first functional groups to Q; wherein Q represents the photo-decomposable functional group; and wherein m is an integer from 1 to 3.

5. The method of claim 3, wherein the photo-decomposable cross-linking agent is defined by a general formula (II) of:

wherein FG' represents the first functional group selected from primary amines, secondary amines, hydroxyls, amides, esters, epoxies, episulfides, or anhydrides; L' and L" represent linking groups covalently bonding the first functional groups to an iodonium group (I⁺), said $L^1$ and $L^2$ comprising substituted or unsubstituted aryls; and wherein A is an anion of a complex metal halide or a strong protonic acid.

6. The method of claim 3, wherein the photo-decomposable cross-linking agent is defined by a general formula (III) of:

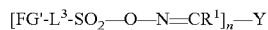

wherein FG' represents the first functional group selected from primary amines, secondary amines, hydroxyls, amides, esters, epoxies, episulfides, or anhydrides; wherein $L^3$ is a linking group covalently bonding FG' to a sulfonyl ($SO_2$) group; wherein $R^1$ comprises a substituted or unsubstituted alkyl, a haloalkyl, a cycloalkyl, a heterocycle, an aryl, a heteroaryl, or an alkaryl; n is an integer greater than 1 in order to provide a plurality of first functional groups ($FG^1$); and Y comprises a carbon-containing connecting member which covalently links the plurality of first functional groups with each other.

7. The method of claim 3, wherein the photo-decomposable cross-linking agent is defined by a general formula (IV) of:

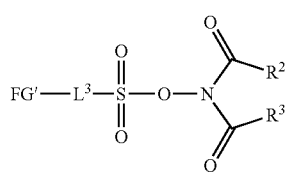

wherein FG' represents the first functional group selected from primary amines, secondary amines, hydroxyls, amides, esters, epoxies, episulfides, or anhydrides; wherein $L^3$ is a linking group covalently bonding FG' to a sulfonyl ($SO_2$) group; wherein $R^2$ and $R^3$ can be the same or different carbon-containing moiety, or in combination form a carbon-containing ring, provided that at least one of $R^2$, $R^3$, or the carbon-containing ring is substituted with at least one FG'.

8. The method of claim 3, wherein the photo-decomposable cross-linking agent is defined by a general formula (V) of:

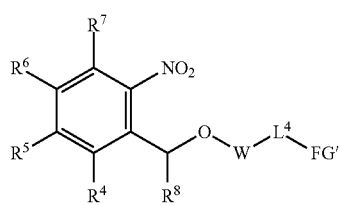

wherein FG' represents the first functional group selected from primary amines, secondary amines, hydroxyls, amides, esters, epoxies, episulfides, or anhydrides; wherein W is selected from a carbonyl (C=O) group or a sulfonyl ($SO_2$) group; wherein $L^4$ is a linking group covalently bonding FG' to W; and wherein $R^4$, $R^5$, $R^6$, $R^7$, and $R^8$ are independently selected from H; a halide; a substituted or unsubstituted alkyl, cycloalkyl, aryl, alkaryl, or ether groups; a haloalkyl; a heterocycle; a heteroaryl; an alkoxyl; or combinations thereof, provided that at least one of at least one of $R^4$, $R^5$, $R^6$, $R^7$, or $R^8$ comprises a functional group selected from primary amines, secondary amines, hydroxyls, amides, esters, epoxies, episulfides, and anhydrides.

9. The method of claim 3, wherein the photo-decomposable cross-linking agent is defined by a general formula (VI) of:

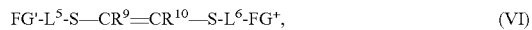

wherein FG' represents the first functional group selected from primary amines, secondary amines, hydroxyls, amides, esters, epoxies, episulfides, or anhydrides; wherein $R^9$ and $R^{10}$ are independently selected from H, or substituted or unsubstituted carbon-containing chains and rings; and wherein $L^5$ and $L^6$ are linking groups covalently bonding FG' to sulfur.

10. The method of claim 3, wherein forming the block copolymer pattern comprises:
    forming a layer of the block copolymer, the block copolymer having a χN parameter equal to or greater than about 10.5 and comprising a first polymer block and a second polymer block;
    annealing the layer of the block copolymer to form the block copolymer pattern comprising a plurality of domains; and
    optionally, selectively removing a first domain of the block copolymer pattern, while leaving behind a second domain of the block copolymer pattern.

11. The method of claim 3, wherein the forming the layer of the radiation sensitive material comprises:
    casting a solution of the radiation sensitive material in a solvent on the first layer of material;
    removing the solvent; and
    heating the layer to the temperature at or above the cross-linking reaction temperature prior to imaging the second layer of the photosensitive material with patterned light.

12. The method of claim 1,
    wherein the layer of the radiation sensitive material further comprises an acidic compound, and the photo-decomposable cross-linking agent comprises a plurality of a first functional group (FG') covalently bonded to one another through a photo-decomposable functional group;
    wherein the photo-sensitive component of the radiation sensitive material further comprises a photo-base generator;
    wherein the cross-linkable polymer of the radiation sensitive material comprises a plurality of a second functional group (FG"), wherein the second functional group (FG") reacts with the first functional group (FG') upon the heating to the temperature at or above the cross-linking reaction temperature;
    wherein the first region has substantial portions of the photo-decomposable cross-linking agent and the photo-base generator decomposed and the second region has substantial portions of the photo-decomposable cross-linking agent and the photo-base generator intact; and
    wherein the developing is a positive-tone development.

13. The method of claim 12, wherein the imaging the layer of radiation sensitive material with patterned light generates an organic amine as a decomposition product of the photo-base generator following exposure to activating radiation.

14. The method of claim 12, wherein the photo-base generator is a neutral compound.

15. The method of claim 12, wherein the photo-base generator is selected from the group consisting of carbamates, O-carbamoylhydroxylamines, O-carbomyloximes, aromatic sulfonamides, alpha-lactams, and N-(2-arylethylenyl) amides.

16. The method of claim 12, wherein forming the block copolymer pattern comprises:
   forming a layer of the block copolymer, the block copolymer having a χN parameter equal to or greater than about 10.5 and comprising a first polymer block and a second polymer block;
   annealing the layer of the block copolymer to form the block copolymer pattern comprising a plurality of domains; and
   optionally, selectively removing a first domain of the block copolymer pattern, while leaving behind a second domain of the block copolymer pattern.

17. The method of claim 1,
   wherein the layer of the radiation sensitive material further comprises an acidic compound, and the photo-decomposable cross-linking agent comprises a plurality of a first: functional group (FG') covalently bonded to one another through a photo-decomposable functional group;
   wherein the photo-sensitive component of the radiation sensitive material further comprises a photo-decomposable base;
   wherein the cross-linkable polymer of the radiation sensitive material comprises a plurality of a second functional group (FG"), wherein the second functional group (FG") reacts with the first functional group (FG') upon the heating to the temperature at or above the cross-linking reaction temperature;
   wherein the first region has substantial portions of the photo-decomposable cross-linking agent and the photo-decomposable base decomposed and the second region has substantial portions of the photo-decomposable cross linking agent and the photo-decomposable base intact; and
   wherein the developing is a negative-tone development.

18. The method of claim 17, wherein the photo-decomposable base comprises a photo-decomposable acid generator component and a conjugate base of a weak acid component, where upon exposure to activating radiation the photo-decomposable acid generator component generates acid that neutralizes the conjugate base of the weak acid component.

19. The method of claim 18, wherein the photo-decomposable acid generator component includes a photosensitive group selected from an iodonium group or a sulfonium group.

20. The method of claim 17, wherein the photo-decomposable base is selected from carboxylate, phenoxide, halogenated alkoxide, or hydroxide salts of trialkylsulfonium, triphenylsulfonium, tris(tert-butylphenyl)sulfonium, diphenyliodonium; bis-(4-tert-butylphenyl)iodonium; or 4-methylphenyl[4-(1-methylethyl)phenyl]iodonium.

21. The method of claim 17, wherein forming the block copolymer pattern comprises:
   forming a layer of the block copolymer, the block copolymer having a χN parameter equal to or greater than about 10.5 and comprising a first polymer block and a second polymer block;
   annealing the layer of the block copolymer to form the block copolymer pattern comprising a plurality of domains; and
   optionally, selectively removing a first domain of the block copolymer pattern, while leaving behind a second domain of the block copolymer pattern.

* * * * *

UNITED STATES PATENT AND TRADEMARK OFFICE
CERTIFICATE OF CORRECTION

PATENT NO. : 8,980,538 B2  Page 1 of 1
APPLICATION NO. : 13/830859
DATED : March 17, 2015
INVENTOR(S) : Mark H. Somervell et al.

It is certified that error appears in the above-identified patent and that said Letters Patent is hereby corrected as shown below:

In the Specification

In Col. 2, line 39, "comprises of a surface" should read --comprises a surface--.

In Col. 3, line 58, "FIG. 7A through 7F" should read --FIGS. 7A through 7F--.

In Col. 9, line 16, Formula (II), "FG' – $L^1$ – I – $L^2$ – FG'A$^-$," should read --FG' – $L^1$ – $I^+$ – $L^2$ – FG'A$^-$,--.

In Col. 15, line 60, "for about a 2" should read --for about 2--.

In Col. 16, line 57, "such N-(2-arylethyenyl)amides," should read --such as N-(2-arylethyenyl)amides,--.

In Col. 18, line 46, "for assembly The" should read --for assembly. The--.

In Col. 19, line 42, "ethyl)phenyl)iodonium." should read --ethyl)phenyl]iodonium.--.

In Col. 19, line 50, "will appreciated" should read --will appreciate--.

In Col. 19, line 54, "and perfluo-1-octanesulfonate" should read --and perfluoro-1-octanesulfonate--.

In Col. 21, line 67, "they are intended" should read --they are not intended--.

In the Claims

In Col. 23, line 19, Claim 6, "groups ($FG^1$);" should read --groups (FG');--.

In Col. 24, line 2, Claim 8, "at least one of at least one of $R^4$" should read --at least one of $R^4$--.

In Col. 24, line 10, Claim 9, Formula (VI), "FG' – $L^5$ – S - $CR^9$=$CR^{10}$ – S – $L^6$ – $FG^+$," should read --FG' – $L^5$ – S - $CR^9$=$CR^{10}$ – S – $L^6$ – FG',--.

In Col. 25, line 20, Claim 17, "first: functional group" should read --first functional group--.

In Col. 26, line 20, Claim 21, "phenyl)iodonium." should read --phenyl]iodonium.--.

Signed and Sealed this
First Day of September, 2015

Michelle K. Lee
*Director of the United States Patent and Trademark Office*